(12) United States Patent
Tsukiyama et al.

(10) Patent No.: US 12,205,875 B2
(45) Date of Patent: Jan. 21, 2025

(54) SEMICONDUCTOR DEVICE AND MANUFACTURING METHOD THEREOF

(71) Applicant: Kioxia Corporation, Tokyo (JP)

(72) Inventors: Satoshi Tsukiyama, Yokohama Kanagawa (JP); Hideo Aoki, Yokohama Kanagawa (JP); Hiroshi Oota, Yokkaichi Mie (JP); Tomoyasu Yamada, Yokkaichi Mie (JP); Yuki Takahashi, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 393 days.

(21) Appl. No.: 17/691,245

(22) Filed: Mar. 10, 2022

(65) Prior Publication Data

US 2023/0058480 A1 Feb. 23, 2023

(30) Foreign Application Priority Data

Aug. 17, 2021 (JP) ................. 2021-132880

(51) Int. Cl.
*H01L 23/00* (2006.01)
*H01L 21/48* (2006.01)
(Continued)

(52) U.S. Cl.
CPC .... *H01L 23/49822* (2013.01); *H01L 21/4857* (2013.01); *H01L 21/486* (2013.01); *H01L 23/49816* (2013.01); *H01L 23/49838* (2013.01); *H01L 24/16* (2013.01); *H01L 24/32* (2013.01); *H01L 24/48* (2013.01); *H01L 24/73* (2013.01); *H01L 25/105* (2013.01); *H01L 2224/16227* (2013.01); *H01L 2224/16237* (2013.01); *H01L 2224/32145* (2013.01); *H01L 2224/32225* (2013.01); *H01L 2224/48095* (2013.01); *H01L 2224/48145* (2013.01);
(Continued)

(58) Field of Classification Search
CPC .......... H01L 23/49822; H01L 21/4857; H01L 21/486; H01L 23/49816; H01L 23/49838; H01L 24/16; H01L 24/32; H01L 24/48; H01L 2224/16227; H01L 2224/16237; H01L 2224/32145; H01L 2225/0651; H01L 2924/1431
See application file for complete search history.

(56) References Cited

U.S. PATENT DOCUMENTS 6,094,354 A 7/2000 Nakajoh et al.
8,952,532 B2 * 2/2015 Zheng ............... H01L 23/49894
257/737
(Continued)

*Primary Examiner* — David Vu
*Assistant Examiner* — Brandon C Fox
(74) *Attorney, Agent, or Firm* — Holtz, Holtz & Volek PC

(57) ABSTRACT

A semiconductor device according to the present embodiment includes a substrate and a semiconductor chip. The substrate has a first face and a plurality of conductive connection parts provided on the first face. The semiconductor chip has a second face that faces the first face and a plurality of connection bumps provided on the second face and electrically connected to the plurality of conductive connection parts. The conductive connection part arranged in a chip outer peripheral region of a chip region on the first face where the semiconductor chip is arranged is different in thickness from the conductive connection part arranged in a chip central region of the chip region.

20 Claims, 24 Drawing Sheets

(51) Int. Cl.
*H01L 23/498* (2006.01)
*H01L 25/10* (2006.01)

(52) U.S. Cl.
CPC ............... *H01L 2224/48227* (2013.01); *H01L 2224/73204* (2013.01); *H01L 2224/73265* (2013.01); *H01L 2225/06506* (2013.01); *H01L 2225/0651* (2013.01); *H01L 2225/06524* (2013.01); *H01L 2225/06562* (2013.01); *H01L 2225/1023* (2013.01); *H01L 2924/1431* (2013.01); *H01L 2924/1438* (2013.01); *H01L 2924/1611* (2013.01); *H01L 2924/16152* (2013.01); *H01L 2924/16251* (2013.01); *H01L 2924/1811* (2013.01); *H01L 2924/182* (2013.01); *H01L 2924/3511* (2013.01)

(56) References Cited

U.S. PATENT DOCUMENTS

| | | |
|---|---|---|
| 9,396,998 B2 | 7/2016 | Kurita et al. |
| 9,622,347 B2 | 4/2017 | Oi et al. |
| 9,852,970 B2 | 12/2017 | Kobayashi et al. |
| 11,476,149 B2 * | 10/2022 | Chen .................. H01L 25/0753 |
| 11,963,307 B2 * | 4/2024 | Doyle .................. B23K 1/0016 |
| 2011/0108982 A1 * | 5/2011 | Kim ..................... H05K 3/3436 |
| | | 174/262 |
| 2012/0319289 A1 | 12/2012 | Mori et al. |
| 2014/0091463 A1 * | 4/2014 | Yu ..................... H01L 23/49838 |
| | | 257/738 |
| 2018/0342475 A1 | 11/2018 | Wirz et al. |
| 2020/0344881 A1 | 10/2020 | Tonaru et al. |
| 2022/0302011 A1 * | 9/2022 | Lin ....................... H01L 21/563 |

* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2021-132880, filed on Aug. 17, 2021, the entire contents of which are incorporated herein by reference.

FIELD

The embodiments of the present invention relate to a semiconductor device and a manufacturing method thereof.

BACKGROUND

In a semiconductor device package structure, a semiconductor chip may be flip-chip connected to a wiring substrate. However, the warpage of the semiconductor chip may make it difficult to appropriately connect the semiconductor chip to the wiring substrate.

DETAILED DESCRIPTION

Figure 1:
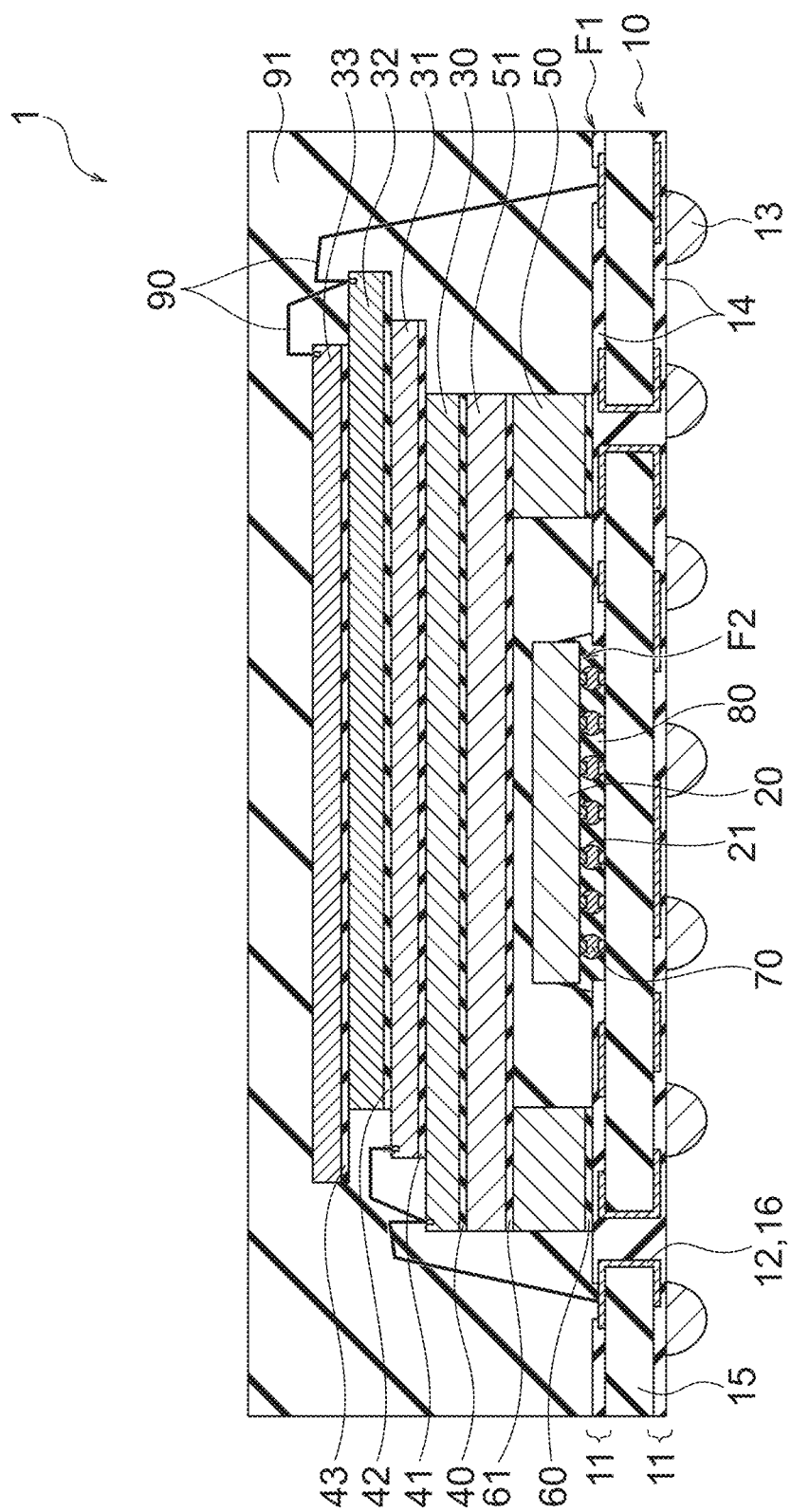
FIG. 1 is a cross-sectional view illustrating an exemplary configuration of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a wiring substrate on which semiconductor chips are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

The semiconductor device according to the present embodiment includes a substrate and a semiconductor chip. The substrate has a first face and a plurality of conductive connection parts provided on the first face. The semiconductor chip has a second face that faces the first face and a plurality of connection bumps provided on the second face and electrically connected to the plurality of conductive connection parts. The conductive connection part arranged in a chip outer peripheral region of a chip region on the first face where the semiconductor chip is arranged is different in thickness from the conductive connection part arranged in a chip central region of the chip region.

First Embodiment

FIG. 1 is a cross-sectional view illustrating an exemplary configuration of a semiconductor device 1 according to a first embodiment. The semiconductor device 1 includes a wiring substrate 10, semiconductor chips 20 and 30 to 33, adhesive layers 40 to 43, spacers 50 and 51, adhesive layers 60 and 61, a metal material 70, a resin layer 80, a bonding wire 90, and a sealing resin 91. The semiconductor device 1 is, for example, a package of NAND-type flash memory.

The wiring substrate 10 may be a printed board or an interposer, which includes wiring layers 11 and an insulation layer 15. For example, a low-resistance metal such as copper (Cu), nickel (Ni) or an alloy thereof is usable for the wiring layer 11. For example, an insulating material such as a glass epoxy resin is usable for the insulation layer 15. In the illustrated example, the wiring layers 11 are provided only on front and back surfaces of the insulation layer 15. However, the wiring substrate 10 may have a multilayered wiring structure in which a plurality of wiring layers 11 and a plurality of insulation layers 15 are laminated. The wiring substrate 10 may have through electrodes 12 (columnar electrodes 16) that are extended from the front surface to the back surface, for example, like an interposer.

A solder resist layer 14 is provided so as to be positioned on the wiring layer 11 on the front surface (face F1) of the wiring substrate 10. The solder resist layer 14 is an insulation layer that protects the wiring layer 11 from the metal material 70 and suppresses short-circuit defects.

The solder resist layer 14 is also provided so as to be positioned on the wiring layer 11 on the back surface of the wiring substrate 10. Metal bumps 13 are provided on the wiring layer 11 exposed from the solder resist layer 14. The metal bumps 13 are provided for electrically connecting other components (not illustrated) and the wiring substrate 10.

The semiconductor chip 20 is a controller chip that controls, for example, a memory chip. A semiconductor element (not illustrated) is provided on a face F2 of the semiconductor chip 20 that faces the wiring substrate 10. The semiconductor element may be, for example, a complementary metal oxide semiconductor (CMOS) circuit that configures a controller. A plurality of electrode pillars 21 electrically connected to the semiconductor element is provided on the face F2 being the back surface (lower surface) of the semiconductor chip 20. For example, a low-resistance metal material such as copper, nickel, or an alloy thereof is usable for the electrode pillar 21.

The metal material 70 is provided around the electrode pillar 21 serving as a connection bump. The electrode pillar 21 is electrically connected, via the metal material 70, to the wiring layer 11 exposed at the opening of the solder resist layer 14. For example, a low-resistance metal material such as solder, silver, or copper, is usable for the metal material 70. The metal material 70 covers, for example, a part of the wiring layer 11 of the wiring substrate 10 in the opening and also covers a part of a side surface of the electrode pillar 21 of the semiconductor chip 20. As a result, the metal material 70 electrically connects the electrode pillar 21 of the semiconductor chip 20 and the wiring layer 11 of the wiring substrate 10.

The resin layer 80 is provided in a region around the metal material 70 and a region between the semiconductor chip 20 and the wiring substrate 10. The resin layer 80 is, for example, a cured underfill resin, and covers and protects the periphery of the semiconductor chip 20.

The semiconductor chip 30 is, for example, a memory chip such as a NAND-type flash memory. The semiconductor chip 30 has semiconductor elements (not illustrated) on a surface thereof (upper surface). The semiconductor elements may be, for example, a memory cell array and its peripheral circuit (CMOS circuit). The memory cell array may be a three-dimensional memory cell array including a plurality of memory cells arranged three-dimensionally. Further, the semiconductor chip 31 is adhered, via the adhesive layer 41, to the semiconductor chip 30. The semiconductor chip 32 is adhered, via the adhesive layer 42, to the semiconductor chip 31. The semiconductor chip 33 is adhered, via the adhesive layer 43, to the semiconductor chip 32. Each of the semiconductor chips 31 to 33 is, for example, a memory chip such as a NAND-type flash memory, similar to the semiconductor chip 30. The semiconductor chips 30 to 33 may be the same memory chips. In the drawing, the semiconductor chips 30 to 33 are laminated as four memory chips, in addition to the semiconductor chip 20 serving as the controller chip. However, the number of laminated semiconductor chips may be 3 or less or may be 5 or more.

The spacer 50 is provided, for example, on the side of the semiconductor chip 20. The spacer 50 is adhered, via the adhesive layer 60, to the surface (upper surface) of the wiring substrate 10. The adhesive layer 60 is provided between the wiring substrate 10 and the spacer 50. The spacer 51 is provided above the semiconductor chip 20. The semiconductor chips 30 to 33 are provided above the spacer 51. The spacer 51 is adhered, via the adhesive layer 61, to the upper surface of the spacer 50. The adhesive layer 61 is provided between the spacer 50 and the spacer 51. The material of spacers 50 and 51 is, for example, silicon (Si) or polyimide.

The bonding wire 90 is connected to any pad of the wiring substrate 10 and the semiconductor chips 30 to 33. Because of the connection using the bonding wire 90, the semiconductor chips 30 to 33 are laminated so as to be offset by the amount of the pad. Since the semiconductor chip 20 is flip-chip connected by the electrode pillars 21, it is not wire-bonded. However, the semiconductor chip 20 may be wire-bonded in addition to the connection by the electrode pillars 21.

Further, the sealing resin 91 seals the semiconductor chip 20 and 30 to 33, the adhesive layers 40 to 43, 60, 61, the spacers 50 and 51, the bonding wire 90 and the like. As a result, the semiconductor device 1 is configured in such a manner that the semiconductor chips 20 and 30 to 33 cooperatively constitute a single semiconductor package on the wiring substrate 10. In a case of not providing the resin layer 80, the sealing resin 91 may be provided instead of the resin layer 80, in the region around the metal material 70 and in the region between the semiconductor chip 20 and the wiring substrate 10.

Next, the connection between the wiring substrate 10 and the semiconductor chip 20 will be described in detail.

Figure 2:
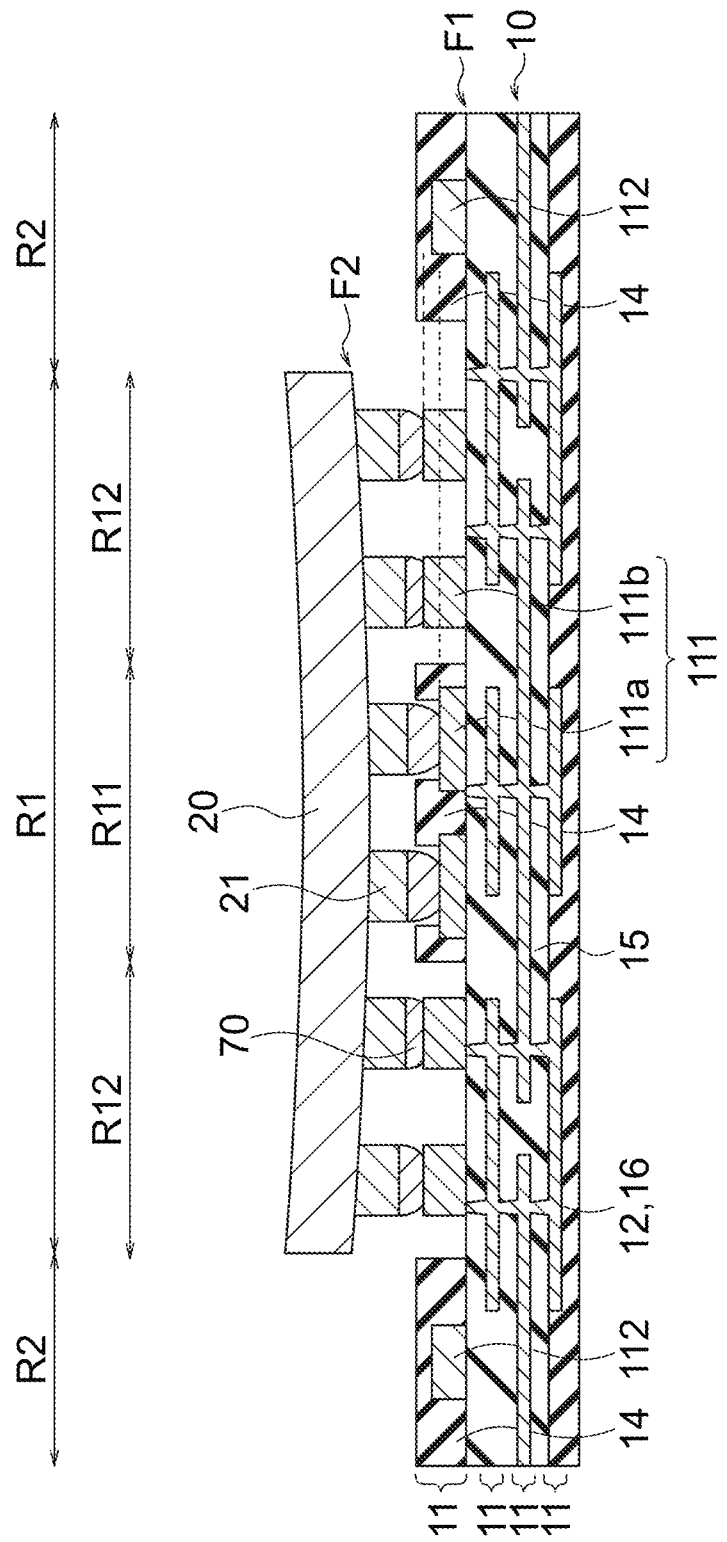
FIG. 2 is a cross-sectional view illustrating an exemplary configuration of a semiconductor chip and its surroundings according to the first embodiment.

FIG. 2 is a cross-sectional view illustrating an exemplary configuration of the semiconductor chip 20 and its surroundings according to the first embodiment. FIG. 2 illustrates a cross section at the time of connecting the semiconductor chip 20 to the wiring substrate 10. The timing of connecting the semiconductor chip 20 to the wiring substrate 10 is, for example, a reflow process during which the metal material 70 is heat-treated at the temperature equal to or higher than the melting point thereof. Further, in the illustration of FIG. 2, the wiring layer 11 being the uppermost layer is enlarged in the thickness direction.

The wiring layer 11 being the uppermost layer arranged on the face F1 side includes a plurality of conductive connection parts 111 and peripheral wiring parts 112.

The conductive connection part 111 is provided on the face F1. The conductive connection part 111 is arranged in a chip region R1 on the face F1 where the semiconductor chip 20 is arranged. The conductive connection part 111 is exposed at least partly from the solder resist layer 14. The conductive connection part 111 electrically connects the wiring substrate 10 and the semiconductor chip 20 by coming into contact with the metal material 70. The electrode pillars 21 provided on the face F2 are electrically connected to the conductive connection parts 111 provided on the face F1.

The conductive connection part 111 includes a conductive connection part 111a and a conductive connection part 111b.

The conductive connection part 111a is arranged in a chip central region R11 of the chip region R1. Further, the conductive connection part 111a has a side surface covered by the solder resist layer 14, for example.

The conductive connection part 111b is arranged in a chip outer peripheral region R12 of the chip region R1. Further, the conductive connection part 111b has a side surface exposed from the solder resist layer 14, for example.

The chip region R1 is divided into, for example, the chip central region R11 and the chip outer peripheral region R12 on the outer periphery of the chip central region R11. The area of the chip central region R11 is, for example, equal to or less than a half of the chip size. The area of the chip outer peripheral region R12 is, for example, equal to or greater than the half of the chip size. However, the area ratio is not limited to the above and may be changed.

The peripheral wiring parts 112 are provided on the face F1. The peripheral wiring parts 112 are arranged on a peripheral region R2, which is different from the chip region R1, on the face F1. The peripheral wiring parts 112 is, for example, covered with the solder resist layer 14. The peripheral wiring parts 112 may be partly exposed from the solder resist layer 14 so as to be electrically connected to the bonding wire 90 illustrated in FIG. 1, for example.

In the reflow process, the semiconductor chip 20 illustrated in FIG. 2 warps and protrude downward. For example, the difference in thermal expansion coefficient between the material (for example, silicon (Si)) of a semiconductor substrate and the metal of a semiconductor element causes the warpage of the semiconductor chip 20.

As illustrated in FIG. 2, the conductive connection part 111b arranged in the chip outer peripheral region R12 is different in thickness from the conductive connection part 111a arranged in the chip central region R11. As a result, even if the semiconductor chip 20 is warped, the wiring substrate 10 and the semiconductor chip 20 can be appropriately connected.

More specifically, the conductive connection part 111b arranged in the chip outer peripheral region R12 is thicker than the conductive connection part 111a arranged in the chip central region R11. As a result, even when the semiconductor chip 20 warps and protrudes downward, the wiring substrate 10 and the semiconductor chip 20 can be appropriately connected in the chip outer peripheral region R12.

Further, it is preferable that the difference between the thickness of the conductive connection part 111b arranged in the chip outer peripheral region R12 and the thickness of the conductive connection part 111a arranged in the chip central region R11 corresponds to the warpage of the semiconductor chip 20 occurring at the time of being connected to the wiring substrate 10. The amount of warpage of the semiconductor chip 20 is, for example, the difference in height between the central part and the outer peripheral end part of the semiconductor chip 20.

The difference between the maximum value and the minimum value in the thickness of conductive connection parts 111a and 111b, of the plurality of conductive connection parts 111a and 111b, is in the range of approximately 3 μm to approximately 20 μm, for example. More specifically, the difference in height between the conductive connection part 111a and the conductive connection part 111b is in the range of approximately 3 μm to approximately 20 μm, for example.

Further, the peripheral wiring part 112 has a thickness between the thickness of the conductive connection part 111a and the thickness of the conductive connection part 111b.

Figure 3:
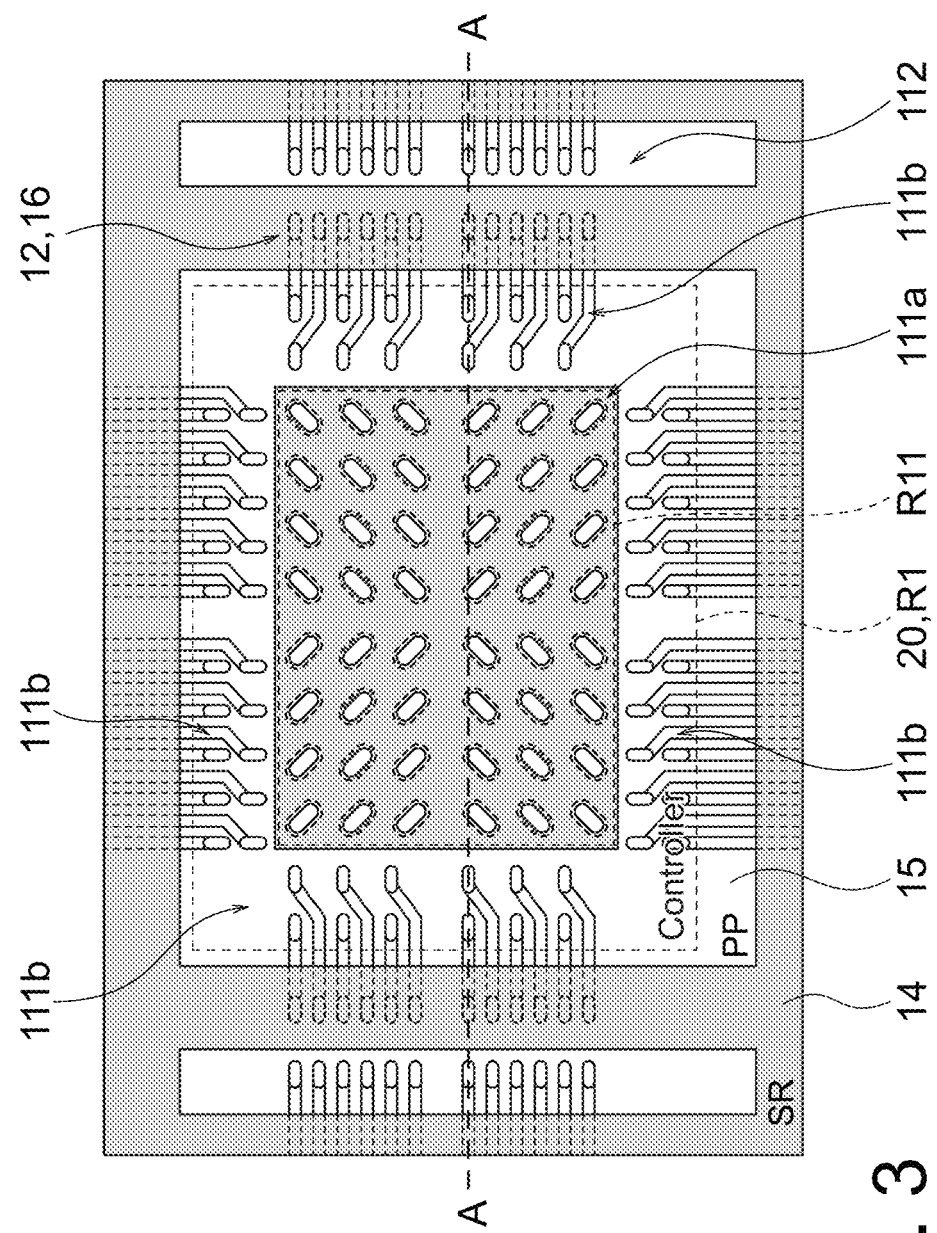
FIG. 3 is a plan view illustrating an exemplary configuration of the semiconductor device according to the first embodiment.

FIG. 3 is a plan view illustrating an exemplary configuration of the semiconductor device 1 according to the first embodiment. In FIG. 3, a line A-A indicates the position of a cross section corresponding to the cross-sectional view of FIG. 2.

In the example illustrated in FIG. 3, the solder resist layer 14 (SR) is not provided in the chip outer peripheral region R12, and the insulation layer 15 (for example, prepreg (PP)) is exposed in the chip outer peripheral region R12.

The conductive connection part 111a has, for example, a pad shape. Although the shape of the conductive connection part 111a illustrated in FIG. 3 is substantially elliptical, but it may be rectangular or substantially circular. The upper surface of the conductive connection part 111a is exposed from the solder resist layer 14. The conductive connection part 111b has, for example, a wiring shape (finger-like shape). The conductive connection part 111b illustrated in FIG. 3 has an elongated shape. Further, as illustrated in FIG. 3, the area of the conductive connection part 111a is larger than the area of the conductive connection part 111b.

Next, the conductive connection parts 111a and 111b will be described in detail.

Figure 4A:
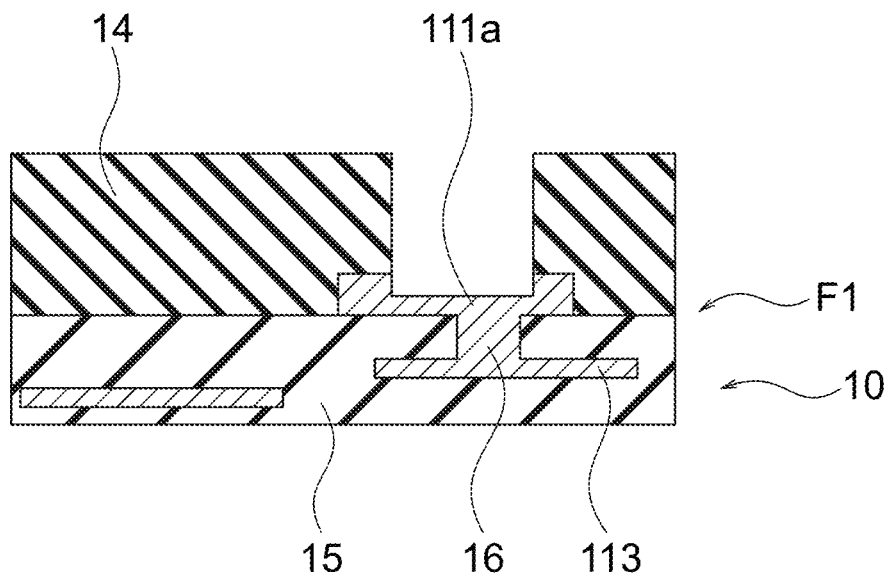
FIG. 4A is a cross-sectional view illustrating an exemplary configuration of the semiconductor device according to the first embodiment.
Figure 4B:
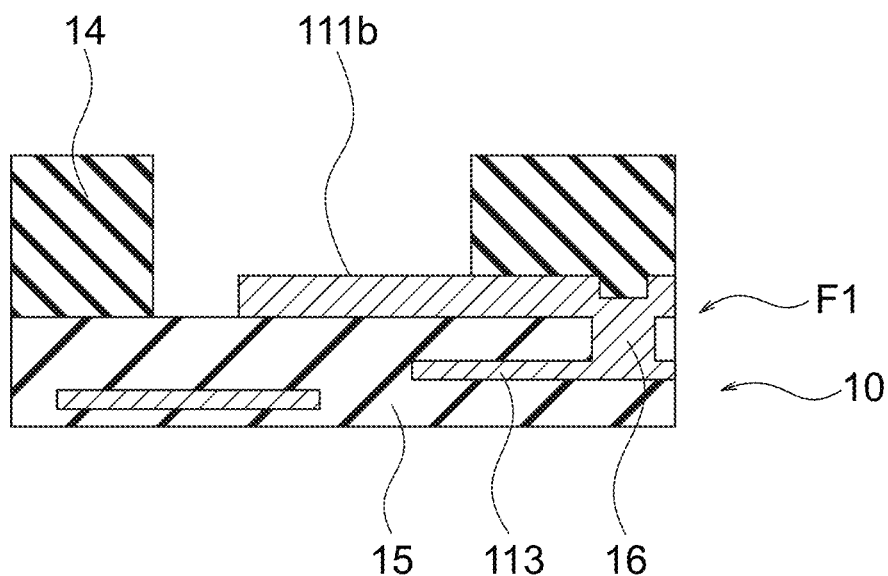
FIG. 4B is a cross-sectional view illustrating an exemplary configuration of the semiconductor device according to the first embodiment.

FIGS. 4A and 4B are cross-sectional views illustrating an exemplary configuration of the semiconductor device 1 according to the first embodiment. FIG. 4A is a cross-sectional view illustrating the conductive connection part 111a arranged in the chip central region R11. FIG. 4B is a cross-sectional view illustrating the conductive connection part 111b arranged in the chip outer peripheral region R12.

Further, the wiring substrate 10 has a plurality of columnar electrodes (VIA) 16. The columnar electrode 16 electrically connects the uppermost wiring layer 11 and another wiring layer 11. The columnar electrode 16 is provided so as to extend, for example, from an internal wiring 113 in the wiring substrate 10 in the normal direction of the face F1. The columnar electrodes 16 are electrically connected to the conductive connection parts 111.

As illustrated in FIGS. 3 and 4A, the conductive connection part 111a is arranged so as to be overlapped with the columnar electrode 16 when viewed in the normal direction of the face F1. The conductive connection part 111a and the columnar electrode 16 have, for example, a pad-on-via structure.

As illustrated in FIGS. 3 and 4B, the conductive connection part 111b is arranged away from the columnar electrode 16 when viewed in the normal direction of the face F1. That is, the conductive connection part 111b is arranged so as to be extracted from the columnar electrode 16 along the face F1.

Further, as illustrated in FIG. 2, the conductive connection part 111b is thicker than the conductive connection part 111a.

Next, the manufacturing method of the semiconductor device 1 will be described. Specifically, the method for forming the conductive connection parts 111a and 111b illustrated in FIGS. 4A and 4B will be described in more detail.

FIGS. 5 to 10 are cross-sectional views illustrating an exemplary method for manufacturing the semiconductor device 1 according to the first embodiment. FIGS. 5 to 10 illustrate cross sections in each of the chip central region R11 and the chip outer peripheral region R12.

Figure 5:
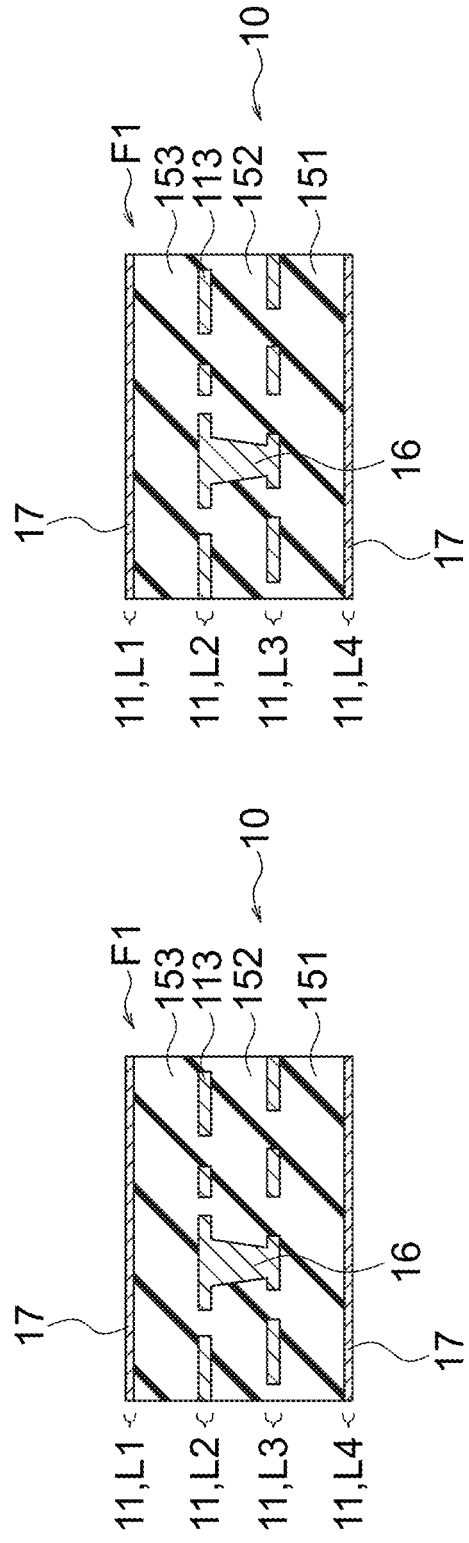
FIG. 5 is a cross-sectional view illustrating an exemplary semiconductor device manufacturing method according to the first embodiment.

First, as illustrated in FIG. 5, the wiring substrate 10 is prepared. In the example illustrated in FIG. 5, the wiring substrate 10 has three insulation layers 151 to 153 and four wiring layers L1 to L4. The insulation layers 151 to 153 are included in the insulation layer 15 and are, for example, prepregs. The wiring layers L2 and L3 have circuits formed by patterning using photolithography or the like. For example, thin copper foils 17 are formed on the wiring layers L1 and L4. In the example illustrated in FIG. 5, the columnar electrode 16 is formed between the wiring layer L2 and the wiring layer L3. Further, in FIG. 5, the internal wiring 113 is partly illustrated.

Figure 6:
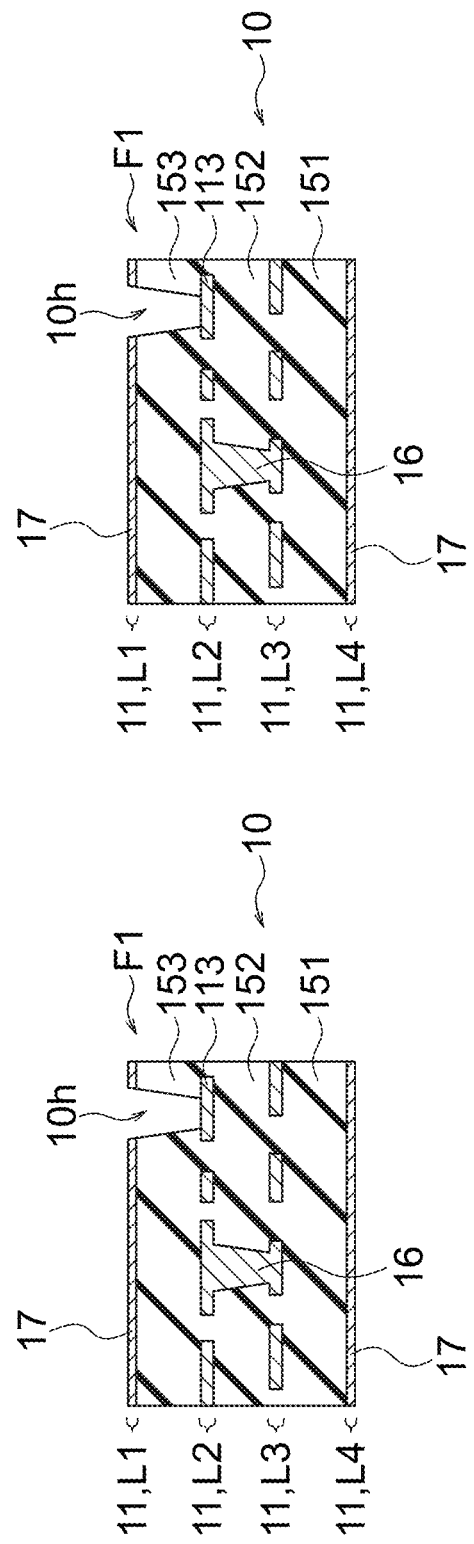
FIG. 6 is a cross-sectional view illustrating an exemplary semiconductor device manufacturing method, which follows the process illustrated in FIG. 5.

Next, as illustrated in FIG. 6, a hole 10h is formed in the insulation layer 153 from the face F1 side so as to reach the internal wiring 113 of the wiring layer L2. The hole 10h is formed, for example, by a laser or the like.

Figure 7:
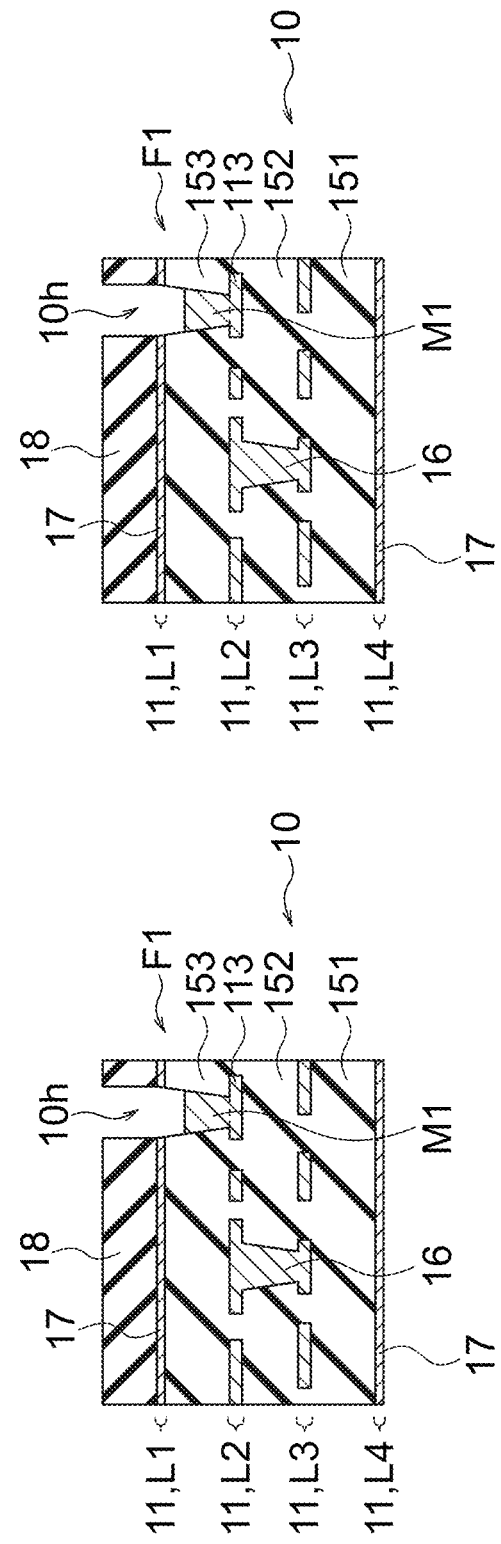
FIG. 7 is a cross-sectional view illustrating an exemplary semiconductor device manufacturing method, which follows the process illustrated in FIG. 6.

Next, as illustrated in FIG. 7, a plating resist layer 18 that functions as a mask is formed on the copper foil 17 of the wiring layer L1, and a metal layer M1 is formed so as to fill the hole 10h. Before forming the metal layer M1, a seed layer (not illustrated) may be formed in the hole 10h (for example, on its side wall). For example, formation of the seed layer may include sputtering for formation of chromium (Cr), titanium (Ti) or an alloy thereof and electroless plating for formation of copper. The plating resist layer 18 is formed to open the hole 10h, which is the region where the columnar electrode 16 is formed, for example. The metal layer M1 is a base layer. The metal layer M1 is formed so as to be lower than the hole 10h. That is, the metal layer M1 is formed to a predetermined height lower than the face F1. More specifically, the metal layer M1 is formed so as to extend from the internal wiring 113 to the predetermined height lower than the face F1. The metal layer M1 is, for example, formed by electroless plating.

In the electroless plating, if surface conditions are the same, the plating reaction will be the same. Accordingly, the thickness of the metal layer M1 arranged in the chip central region R11 is substantially the same as the thickness of the metal layer M1 arranged in the chip outer peripheral region R12. That is, the multiple metal layers M1 are substantially the same in thickness.

Figure 8:
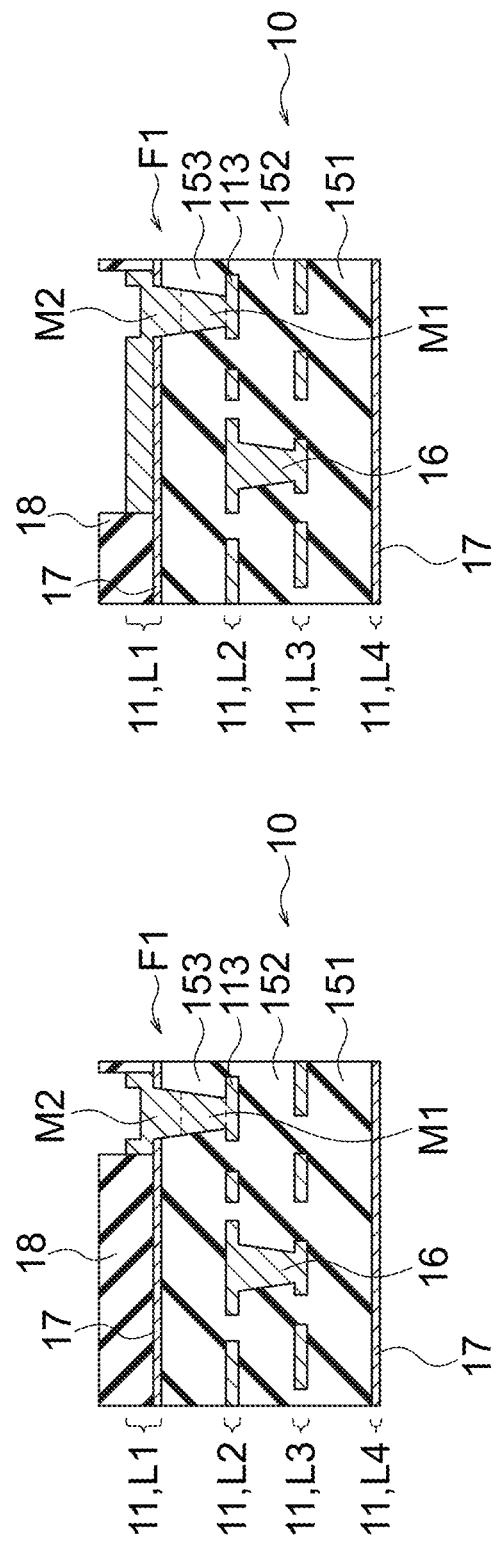
FIG. 8 is a cross-sectional view illustrating an exemplary semiconductor device manufacturing method, which follows the process illustrated in FIG. 7.

Next, as illustrated in FIG. 8, the plating resist layer 18 is peeled off, the plating resist layer 18 is formed again on the copper foil 17 of the wiring layer L1, and the metal layer M2 is formed on the copper foil 17 (the face F1) of the wiring layer L1 and the metal layer M1. The plating resist layer 18 is formed to open the region where the conductive connection parts 111a and 111b are formed, for example. The metal layer M2 is formed, for example, by electrolytic plating. The electrolytic plating is superior to the electroless plating in that the metal layer M2 can be formed in a short time.

Figure 9:
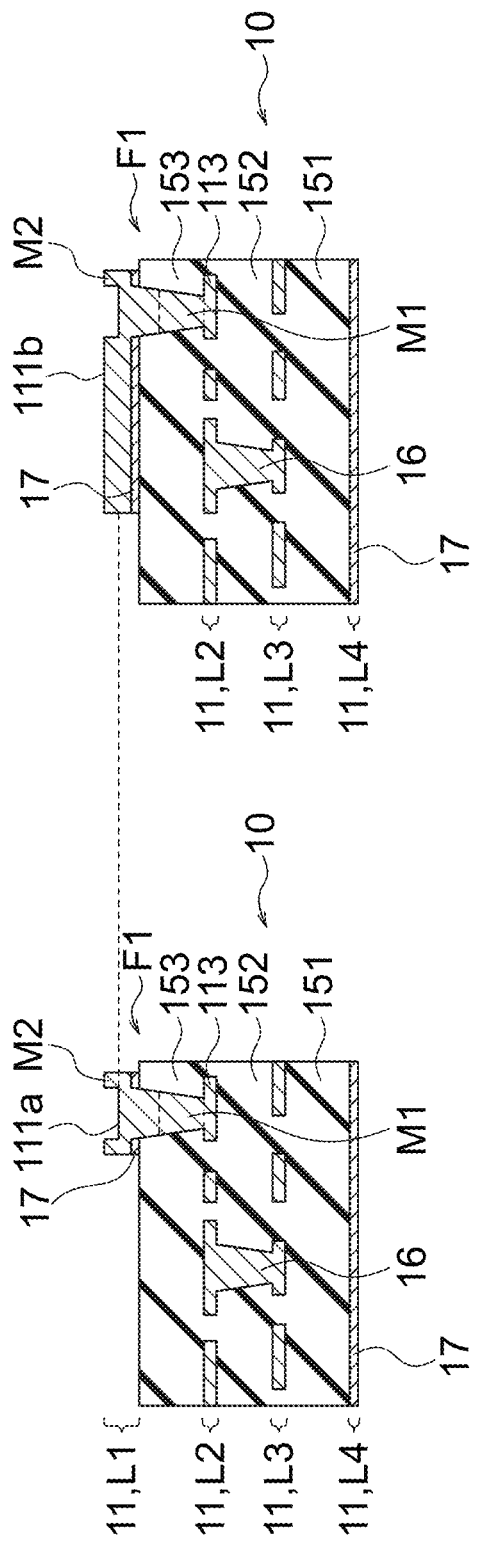
FIG. 9 is a cross-sectional view illustrating an exemplary semiconductor device manufacturing method, which follows the process illustrated in FIG. 8.

Next, as illustrated in FIG. 9, the plating resist layer 18 is peeled off, and the copper foil 17 is etched using the metal layers M1 and M2 as masks.

Here, as illustrated in FIG. 9, the metal layer M2 in the vicinity of the metal layer M1 (the columnar electrode 16) is formed thicker than the upper surface of the metal layer M2 away from the metal layer M1 (the columnar electrode 16). This is because the metal layer M1 is formed so that the metal layer M1 is lower than the face F1. The metal layer M2 in the vicinity of the metal layer M1 is formed so as to partly fill the hole 10h. On the other hand, the metal layer M2 away from the metal layer M1 is formed from the face F1 in the thickness direction. Accordingly, by adjusting the thickness of the metal layer M1, the difference between the thickness of the conductive connection part 111a and the thickness of the conductive connection part 111b can be adjusted. That is, in the process illustrated in FIG. 8, the conductive connection part 111a overlapped with the columnar electrode 16 when viewed in the normal direction of the face F1 is formed in the chip central region R11 on the face F1, and the conductive connection part 111b away from the columnar electrode 16 when viewed in the normal direction of the face F1 is formed in the chip outer peripheral region R12 on the face F1.

Figure 10:
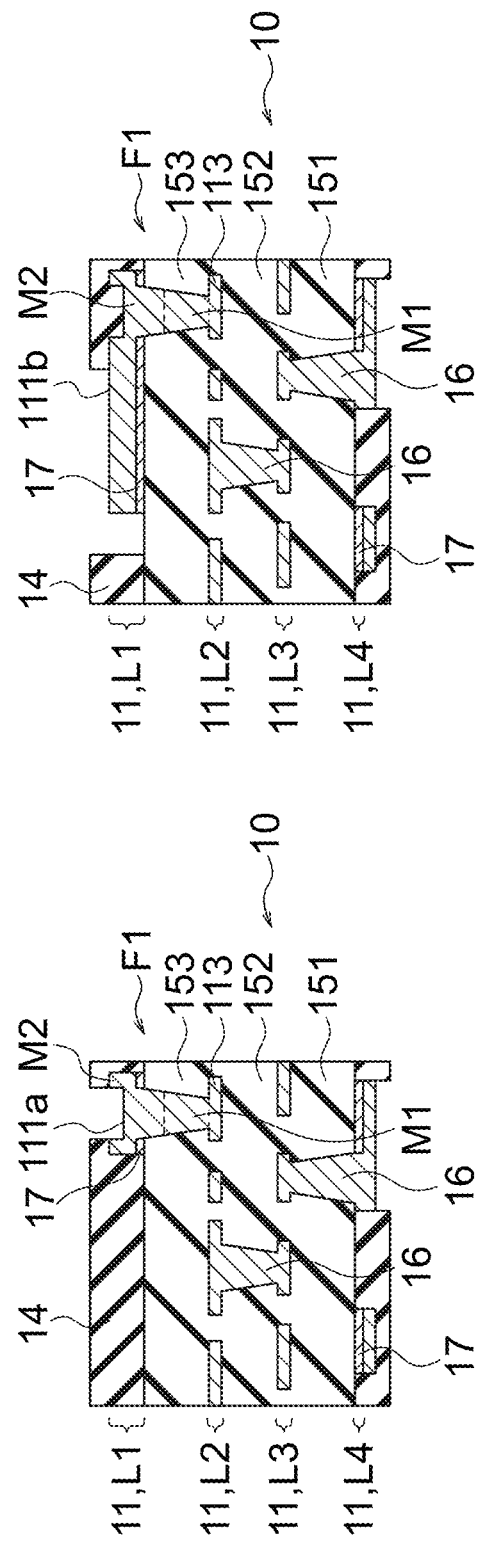
FIG. 10 is a cross-sectional view illustrating an exemplary semiconductor device manufacturing method, which follows the process illustrated in FIG. 9.

Next, as illustrated in FIG. 10, the columnar electrode 16 penetrating the insulation layer 151 is formed. Further, the wiring layer L4 is patterned by using photolithography or the like, and the circuit is formed by plating or the like. Further, the solder resist layer 14 is formed. For example, solder resist is applied to both surfaces of the wiring substrate 10, and is exposed, developed, and cured. As a result, as illustrated in FIGS. 4A and 4B, the conductive connection parts 111a and 111b whose thicknesses vary depending on the position on the face F1 can be formed. After that, the semiconductor chip 20 is provided on the wiring substrate 10 so that the electrode pillars 21 are electrically connected to the conductive connection parts 111a and 111b. Next, by providing the spacers 50 and 51 and the semiconductor chips 30 to 33 or the like, the semiconductor device 1 is completed as illustrated in FIG. 1.

As described above, the conductive connection part 111 and the columnar electrode 16 include the metal layer M1 and the metal layer M2. For example, the metal layer M1 is provided so as to extend from the internal wiring 113 provided inside the wiring substrate 10 in the normal direction of the face F1. The metal layer M2 is provided above the metal layer M1 and is different from the metal layer M1.

The metal layer M1 and the metal layer M2 are different, for example, in material. For example, low-resistance metal materials such as copper, nickel, gold (Au) or an alloy thereof are usable for the metal layers M1 and Further, the metal layer M1 and the metal layer M2 may be formed by using different plating solutions. In this case, for example, the metal layer M1 and the metal layer M2 may be different from each other in, for example, the concentration and type (substance) of impurities even if they are the same in material. The impurities are derived from, for example, additives of the plating solution. In the first embodiment, since the metal layers M1 and M2 are formed by electroless plating and electrolytic plating, respectively, they are usually formed using plating solutions different from each other and further by using furnaces different from each other. As a result, the state of impurities mixed in between the metal layer M1 and the metal layer M2 may change.

As described above, according to the first embodiment, the conductive connection part 111b is different in thickness from the conductive connection part 111a.

If the conductive connection parts 111a and 111b are the same in thickness, there will be a possibility of defectiveness occurring in connection when the semiconductor chip 20 warps and protrudes downward at the time of connection because the conductive connection part 111b arranged in the chip outer peripheral region R12 is separated from the electrode pillars 21.

On the other hand, in the first embodiment, the conductive connection part 111a and the conductive connection part 111b are different in thickness. Therefore, even when the warpage occurs in the semiconductor chip 20, the wiring substrate 10 and the semiconductor chip 20 can be more appropriately connected.

Further, in the first embodiment, the thickness of each of the conductive connection parts 111a and 111b can be changed depending on whether the conductive connection part 111 overlaps with the columnar electrode 16 when viewed in the normal direction of the face F1. Therefore, the conductive connection parts 111a and 111b that are different in thickness can be formed in parallel at the same time.

Further, the multiple conductive connection parts 111a may be different in thickness in the chip central region R11, and the multiple conductive connection parts 111b may be different in thickness in the chip outer peripheral region R12. For example, the conductive connection parts 111a and 111b may gradually change in thickness from the central part to the outer peripheral end part of the semiconductor chip 20. More specifically, the conductive connection parts 111a and 111b may be gradually increased in thickness from the central part to the outer peripheral end part of the semiconductor chip 20. As a result, the wiring substrate 10 and the semiconductor chip 20 can be connected more appropriately. This is because the warpage of the semiconductor chip 20 gradually increases the distance between the wiring substrate 10 and the semiconductor chip 20 in the region from the central part to the outer peripheral end part of the semiconductor chip 20.

Further, in the first embodiment, the conductive connection part 111a has a pad shape and the conductive connection part 111b has a wiring shape (finger-like shape). Further, the conductive connection part 111b that is thicker than the conductive connection part 111a is exposed from the solder resist layer 14 at the side surface thereof, and the metal material 70 (for example, soldering) gets wet according to the warpage of the semiconductor chip 20. Therefore, by using the side surface of the conductive connection part 111b arranged in the chip outer peripheral region R12, the change in height of the semiconductor chip 20 caused by the warpage can be absorbed.

The semiconductor chip 20 may warp and protrude upward, depending on its configuration, at the time of connection. In this case, it suffices that the conductive connection part 111a is thicker than the conductive connection part 111b. Accordingly, it suffices that the relationship in arrangement between the conductive connection parts 111a and 111b and the columnar electrode 16 is reversed. That is, the conductive connection part 111a is arranged away from the columnar electrode 16, when viewed in the normal direction of the face F1. The conductive connection part 111b is arranged so as to overlap with the columnar electrode 16, when viewed in the normal direction of the face F1.

Further, regarding the conductive connection parts 111a and 111b, the peripheral wiring parts 112, and the metal layers M1 and M2, the thickness may be the height of the upper surface.

Further, the electrode pillars 21 of the semiconductor chip 20 may have substantially the same thickness or substantially the same diameter in the region from the central part to the outer peripheral end part of the semiconductor chip 20. That is, the electrode pillars 21 of the semiconductor chip 20 may be substantially uniform in thickness and diameter regardless of the position.

Further, the solder resist layer 14 may be used as the plating resist layer 18.

Further, the timing of forming the plating on the peripheral wiring parts 112 may be the same as or different from the timing of forming the metal layers M2 of the conductive connection parts 111a and 111b, for example.

Second Embodiment

Figure 11:
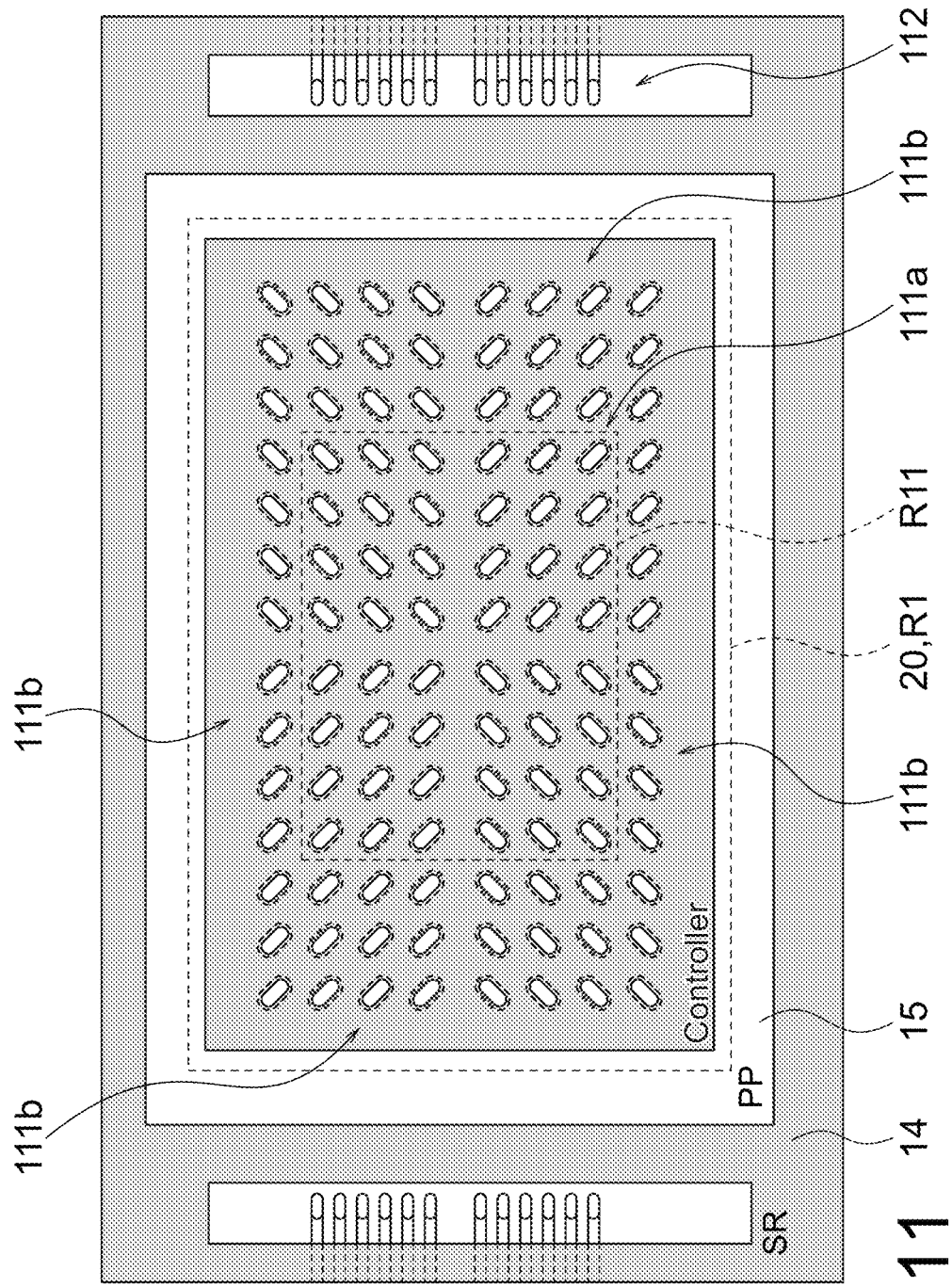
FIG. 11 is a plan view illustrating an exemplary configuration of a semiconductor device according to a second embodiment.

FIG. 11 is a plan view illustrating an exemplary configuration of the semiconductor device 1 according to a second embodiment. The second embodiment is different from the first embodiment in the shape of the conductive connection part 111b and in the positional relationship between the conductive connection part 111b and the columnar electrode 16.

In the example illustrated in FIG. 11, the solder resist layer 14 is also provided in the chip outer peripheral region R12 and is provided on almost the entire surface of the chip region R1.

For example, the conductive connection part 111b has a pad shape similar to that of the conductive connection part 111a. The upper surface of the conductive connection part 111b is exposed from the solder resist layer 14. The conductive connection part 111b has a pad-on-via structure, for example.

Next, the conductive connection parts 111a and 111b will be described in detail.

Figure 12A:
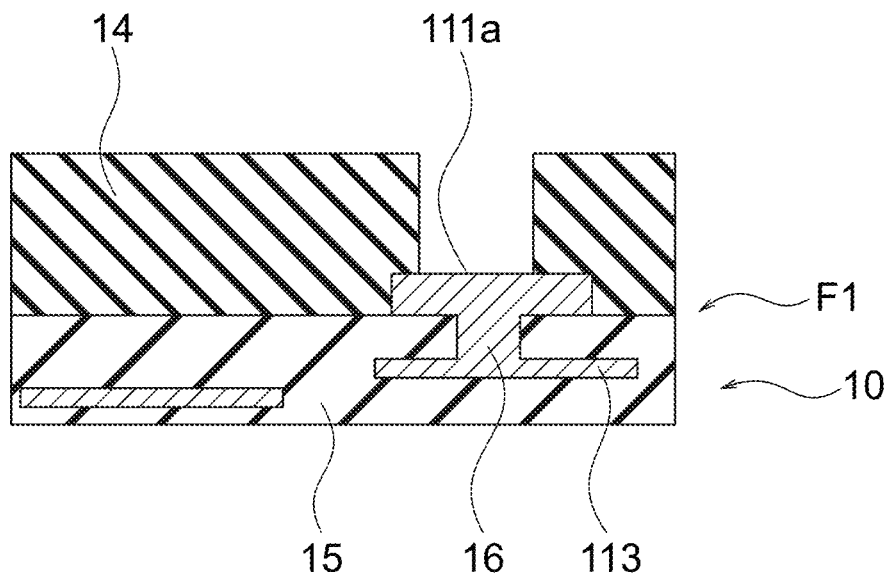
FIG. 12A is a cross-sectional view illustrating an exemplary configuration of the semiconductor device according to the second embodiment.
Figure 12B:
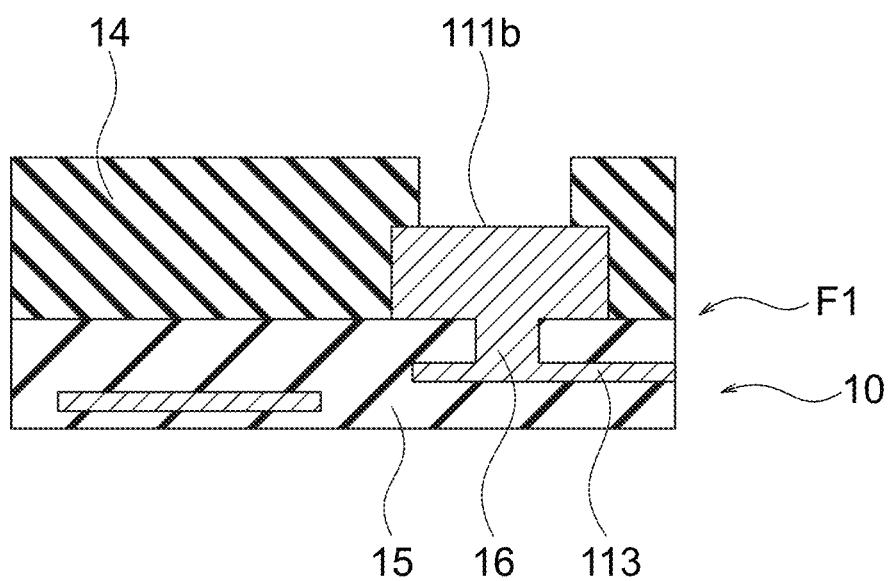
FIG. 12B is a cross-sectional view illustrating an exemplary configuration of the semiconductor device according to the second embodiment.

FIGS. 12A and 12B are cross-sectional views illustrating an exemplary configuration of the semiconductor device 1 according to the second embodiment. FIG. 12A is a cross-sectional view illustrating the conductive connection part 111a arranged in the chip central region R11. FIG. 12B is a cross-sectional view illustrating the conductive connection part 111b arranged in the chip outer peripheral region R12.

As illustrated in FIGS. 11 and 12A, the conductive connection part 111a is arranged so as to overlap with the columnar electrode 16, when viewed in the normal direction of the face F1. The conductive connection part 111a and the columnar electrode 16 have, for example, a pad-on-via structure.

As illustrated in FIGS. 11 and 12B, the conductive connection part 111b is arranged so as to overlap with the columnar electrode 16, when viewed in the normal direction of the face F1. The conductive connection part 111b and the columnar electrode 16 have, for example, a pad-on-via structure.

As illustrated in FIGS. 12A and 12B, the conductive connection part 111b is thicker than the conductive connection part 111a.

The semiconductor device 1 according to the second embodiment is similar to the semiconductor device 1 according to the first embodiment in the rest of the configuration. Therefore, detailed description thereof will not be repeated.

Next, the manufacturing method of the semiconductor device 1 will be described. Specifically, the method for forming the conductive connection parts 111a and 111b illustrated in FIGS. 12A and 12B will be described in more detail.

Figure 13:
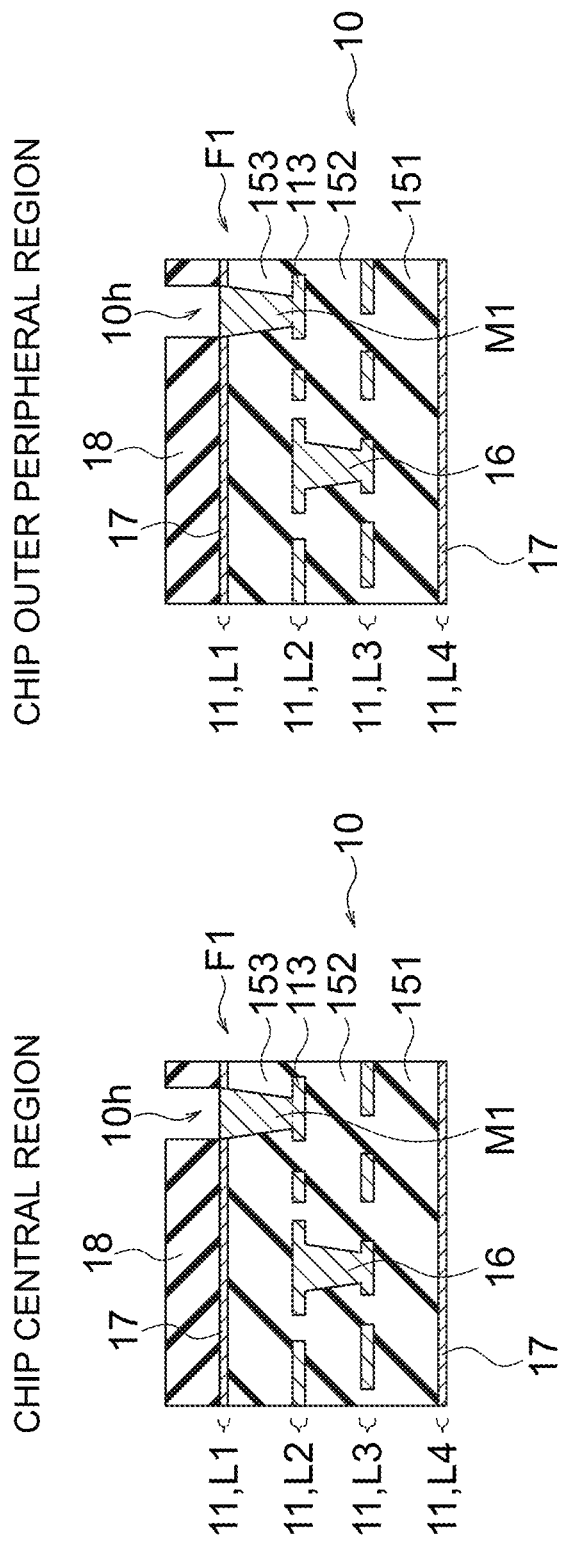
FIG. 13 is a cross-sectional view illustrating an exemplary semiconductor device manufacturing method according to the second embodiment.
Figure 14:
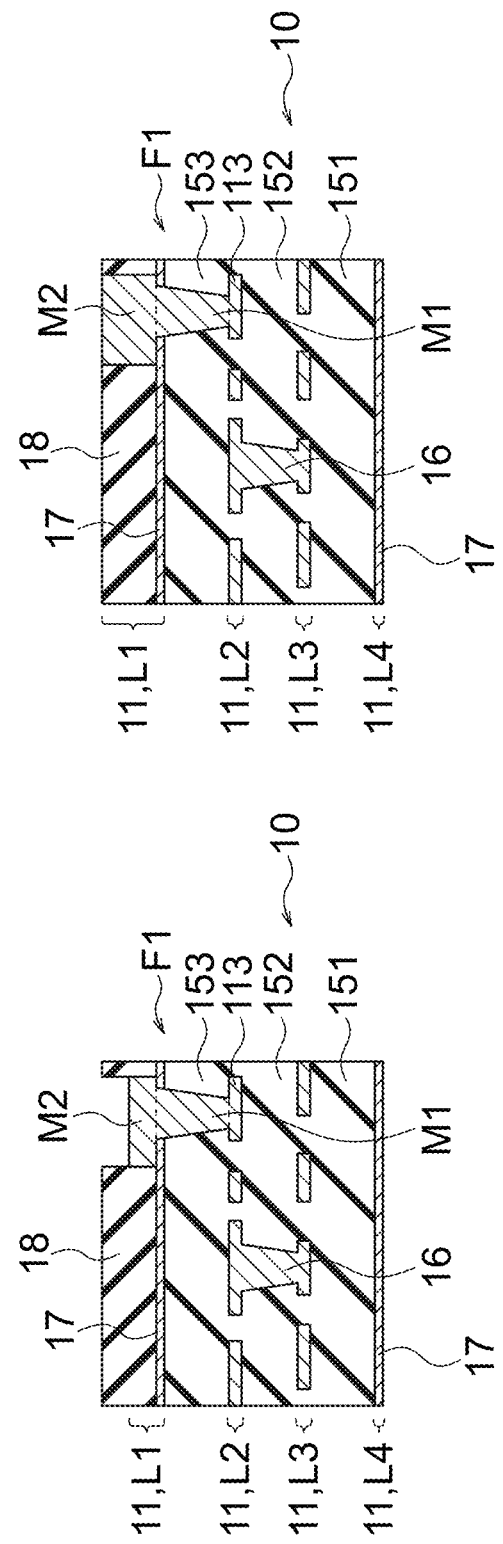
FIG. 14 is a cross-sectional view illustrating an exemplary semiconductor device manufacturing method, which follows the process illustrated in FIG. 13.
Figure 15:
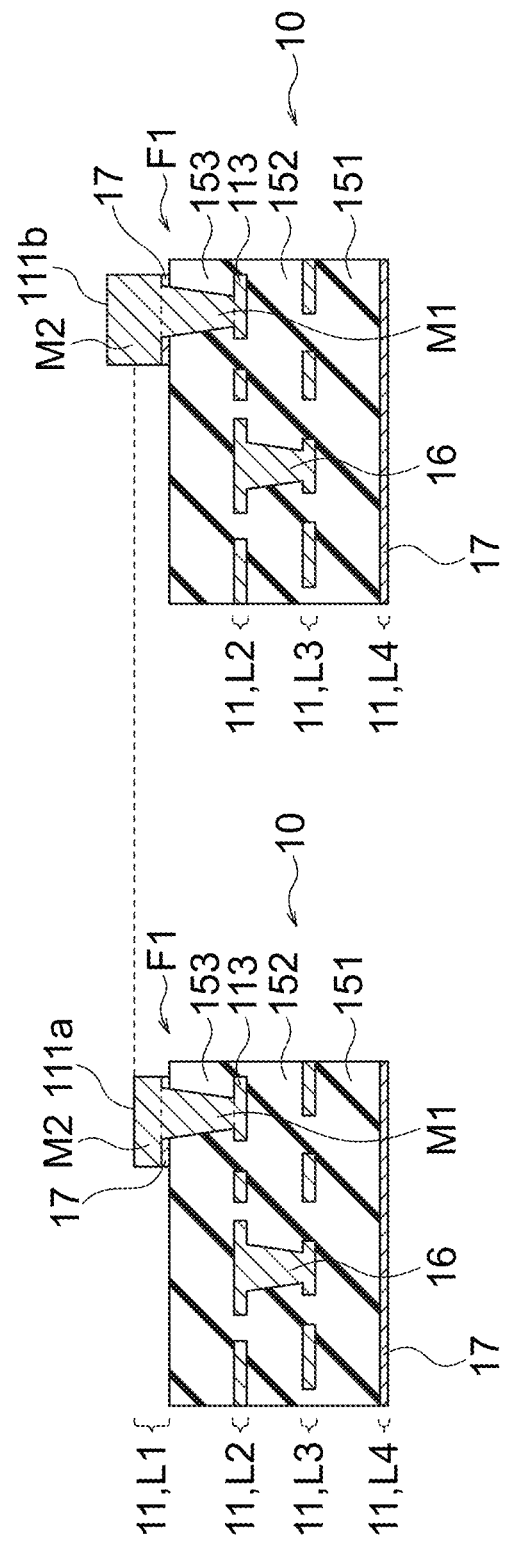
FIG. 15 is a cross-sectional view illustrating an exemplary semiconductor device manufacturing method, which follows the process illustrated in FIG. 14.

FIGS. 13 to 15 are cross-sectional views illustrating an exemplary method for manufacturing the semiconductor device 1 according to the second embodiment. FIGS. 13 to 15 illustrate cross sections in each of the chip central region R11 and the chip outer peripheral region R12.

Processes illustrated in FIGS. 13 to 15 are performed after processes similar to those of FIGS. 5 and 6.

After the formation of the hole 10h (see FIG. 6), as illustrated in FIG. 13, the plating resist layer 18 that functions as a mask is formed on the copper foil 17 of the wiring layer L1 to form the metal layer M1 in the hole 10h. Before forming the metal layer M1, a seed layer may be formed in the hole 10h (for example, on its side wall). The plating resist layer 18 is formed to open the hole 10h, which is the region where the columnar electrode 16 is formed, for example. In the example illustrated in FIG. 13, the metal layer M1 is provided so as to reach the face F1. The metal layer M1 may be provided so as to reach a predetermined height lower than the face F1, or may be provided so as to reach a height higher than the face F1. The metal layer M3 is, for example, formed by electroless plating.

Next, as illustrated in FIG. 14, the plating resist layer 18 is peeled off, the plating resist layer 18 is formed again on the copper foil 17 of the wiring layer L1, and the metal layer M2 is formed on the copper foil 17 (the face F1) of the wiring layer L1 and the metal layer M1. The plating resist layer 18 is formed to open the region where the conductive connection parts 111a and 111b are formed, for example. The metal layer M2 arranged in the chip outer peripheral region R12 is formed thicker than the metal layer M2 arranged in the chip central region R11. The metal layer M2 is, for example, formed by electrolytic plating. The forming method of the metal layer M2 will be described below in detail with reference to FIGS. 16 to 18.

Next, as illustrated in FIG. 15, the plating resist layer 18 is peeled off, and the copper foil 17 of the wiring layer L1 is etched using the metal layers M1 and M2 as masks.

Since the metal layer M2 arranged in the chip outer peripheral region R12 is formed thicker than the metal layer M2 arranged in the chip central region R11, the conductive connection part 111b is thicker than the conductive connection part 111a.

After the process illustrated in FIG. 15, process similar to that of FIG. 10 is performed. Therefore, as illustrated in FIGS. 12A and 12B, the conductive connection parts 111a and 111b whose thicknesses are different depending on the position on the face F1 can be formed.

Next, the forming method of the metal layer M2 will be described in detail.

Figure 16:
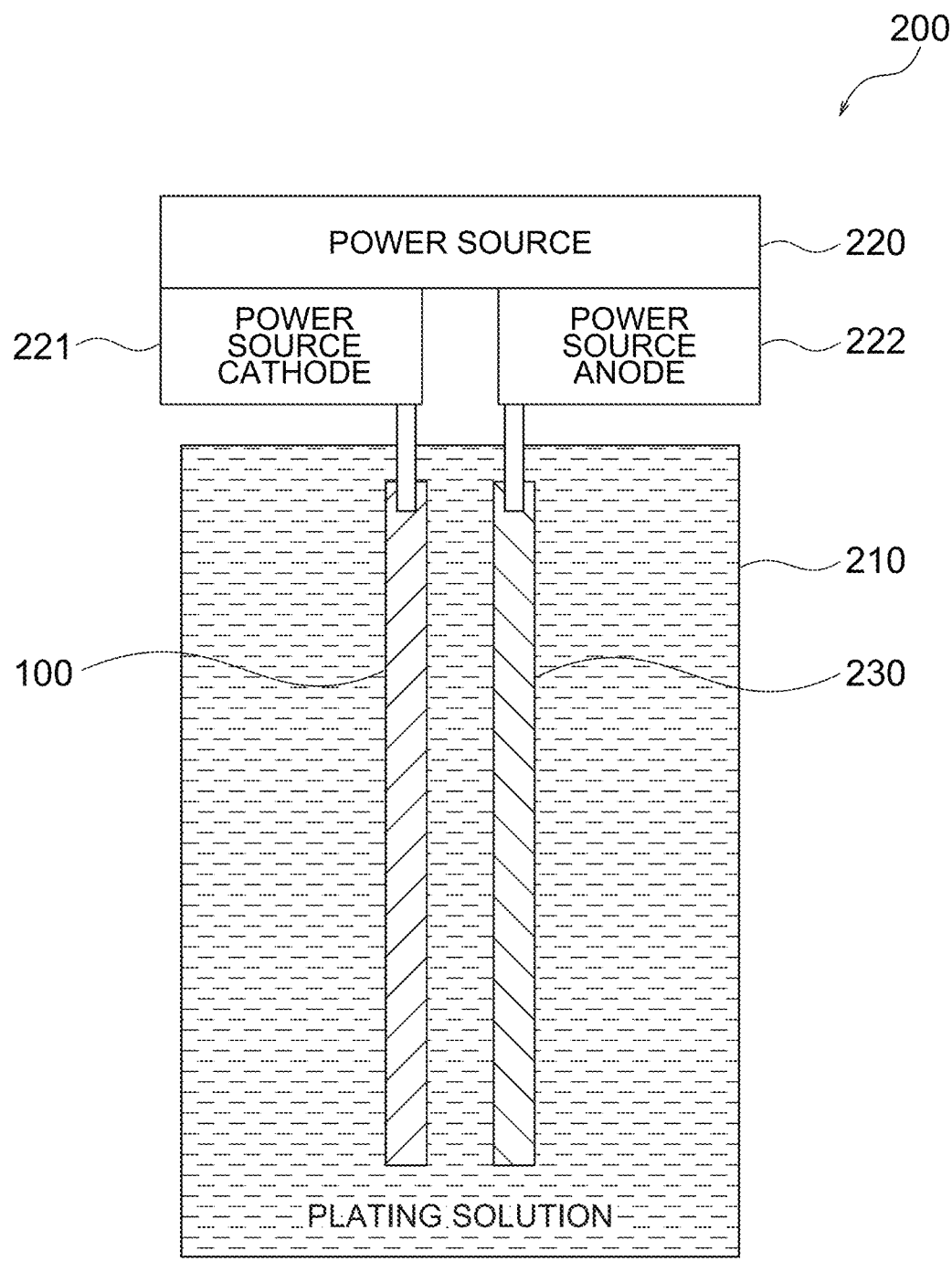
FIG. 16 is a diagram illustrating an exemplary configuration of a plating device according to the second embodiment.

FIG. 16 is a diagram illustrating exemplary configuration of a plating device 200 according to the second embodiment. The plating device 200 performs electrolytic plating. The plating device 200 plates a metal material so that the current density changes depending on the position on the face F1, thereby forming multiple metal layers M2 (the conductive connection parts 111a and 111b) whose thicknesses are different depending on the position on the face F1, on the face F1. The plating thickness of the metal layer M2 is based on the current density and the plating time. More specifically, the thickness of the metal layer M2 is proportional to the product of the current density and the plating time. Accordingly, by changing the current density in electrolytic plating, the thickness of the metal layer M2 can be changed depending on the position on the face F1 if the plating time is the same.

The plating device 200 includes a container 210, a power source 220, and an anode 230.

The container 210 accommodates a multiple substrate 100, the anode 230, and a plating solution. The multiple substrate 100 is, for example, a large-scale substrate including the same wiring patterns of the wiring substrate 10 formed at a plurality of portions on the substrate. Alternatively, the multiple substrate 100 may be a single wiring substrate 10.

The power source 220 has a power source cathode 221 and a power source anode 222. The power source cathode 221 is a terminal electrically connected to the multiple substrate 100. The power source anode 222 is a terminal electrically connected to the anode 230. The power source 220 supplies electric power (for example, voltage) via the power source cathode 221 and the power source anode 222.

The anode 230 is a counter electrode provided so as to face the multiple substrate 100. The anode 230 is, for example, an insoluble anode.

Figure 17:
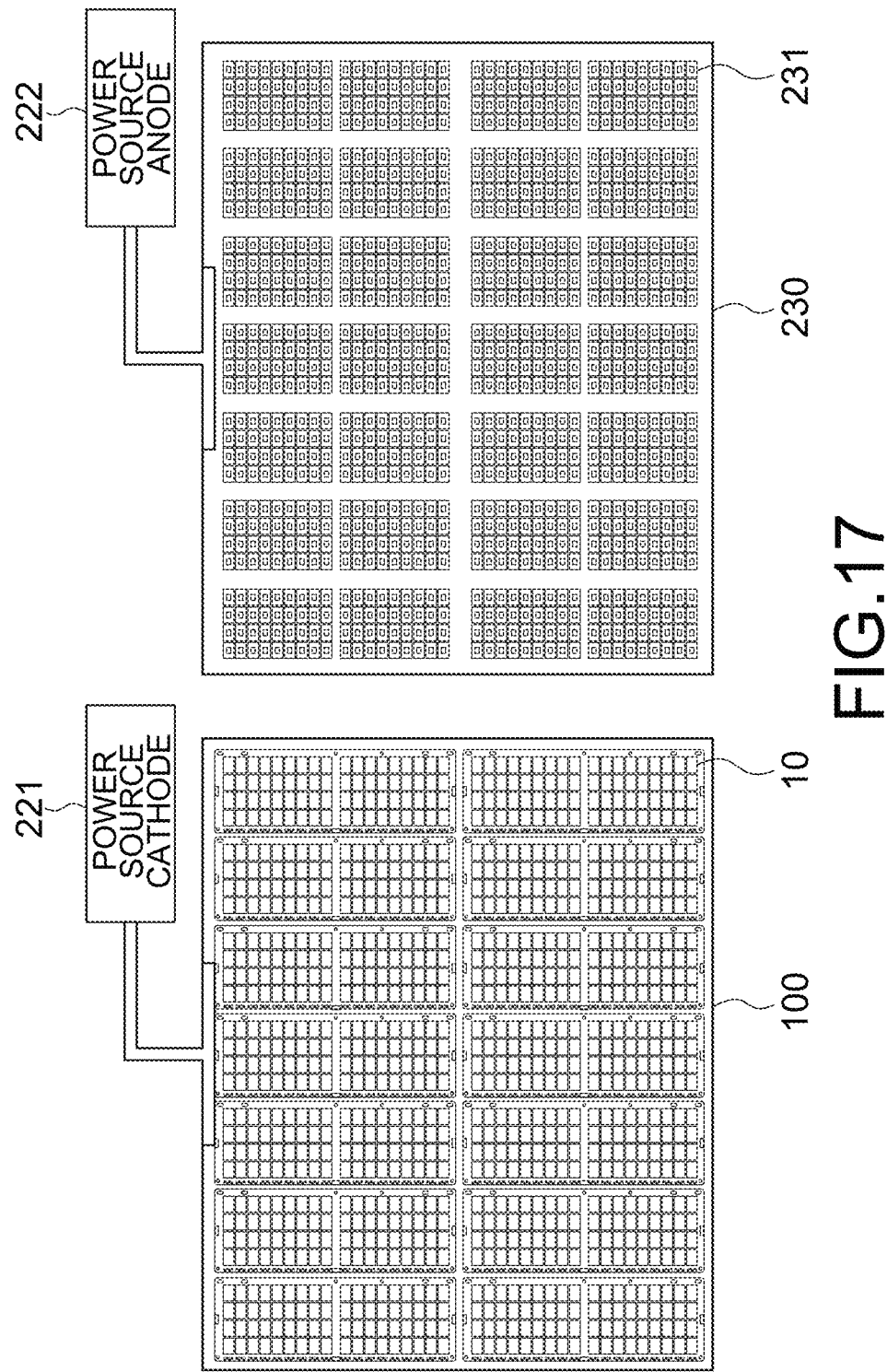
FIG. 17 is a diagram illustrating an exemplary configuration of a multiple substrate and an anode according to the second embodiment.

FIG. 17 is a diagram illustrating exemplary configuration of the multiple substrate 100 and the anode 230 according to the second embodiment.

As illustrated in FIG. 17, the multiple substrate 100 includes a plurality of wiring substrates 10. The anode 230 includes a plurality of unit electrodes 231. The multiple unit electrodes 231 are arranged so as to correspond to the multiple wiring substrates 10.

The electrolytic plating is performed in a state where substantially all the wiring parts of respective wiring substrates 10 are electrically connected by wiring (not illustrated). After the electrolytic plating, extra wiring parts are broken by etching or the like, and each wiring part of the wiring substrate 10 is electrically separated.

Figure 18:
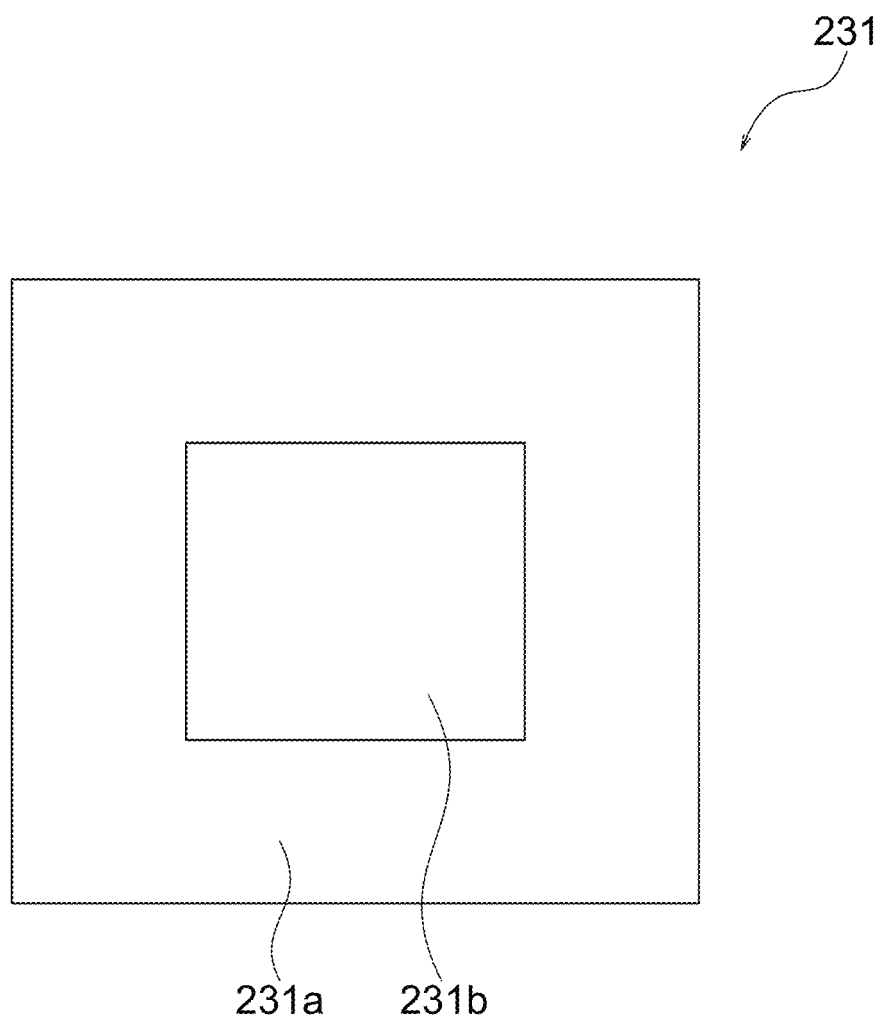
FIG. 18 is a diagram illustrating an exemplary configuration of a unit electrode according to the second embodiment.

FIG. 18 is a diagram illustrating an exemplary configuration of the unit electrode 231 according to the second embodiment.

The unit electrode 231 has an electrode part 231a and an insulating part 231b.

The electrode part 231a functions as an electrode. The insulating part 231b is arranged at the position where the electrode part 231a is not provided. In the example illustrated FIG. 18, the insulating part 231b is arranged in a central region of the unit electrode 231, and the electrode part 231a is arranged around the insulating part 231b.

The plating device 200 is arranged so as to face the wiring substrate 10. By the plating using the counter electrode (the anode 230) having the electrode parts 231a arranged so that the current density changes depending on the position on the face F1, multiple conductive connection parts 111a and 111b whose thicknesses are different depending on the position on the face F1 are formed on the face F1.

As described above, the plating thickness in the electrolytic plating is proportional to the current density. The current density can be adjusted, for example, by adjusting the distance between the electrode part 231a and the plating position of the wiring substrate 10. The chip central region R11 of the wiring substrate 10 mainly faces the insulating part 231b, for example. Since the distance from the electrode part 231a is relatively large, the current density of the chip central region R11 is small. As a result, the metal layer M2 arranged in the chip central region R11 is formed relatively thin. On the other hand, the chip outer peripheral region R12 of the wiring substrate 10 mainly faces the electrode part 231a, for example. Since the distance from the electrode part 231a is relatively smaller, the current density of the chip outer peripheral region R12 is large. As a result, the metal layer M2 formed in the chip outer peripheral region R12 is formed relatively thicker.

As described above, the design of the electrode part 231a of the unit electrode 231 can control the current density according to the position on the wiring substrate 10. As a result, the thickness of the metal layer M2 can be controlled according to the position on the wiring substrate 10.

As described above, according to the second embodiment, in the electrolytic plating, by changing the current density depending on the position on the face F1, the conductive connection parts 111a and 111b different in thickness can be formed.

The semiconductor device 1 according to the second embodiment can obtain effects similar to those of the first embodiment.

Modified Example of the Second Embodiment

Figure 19:
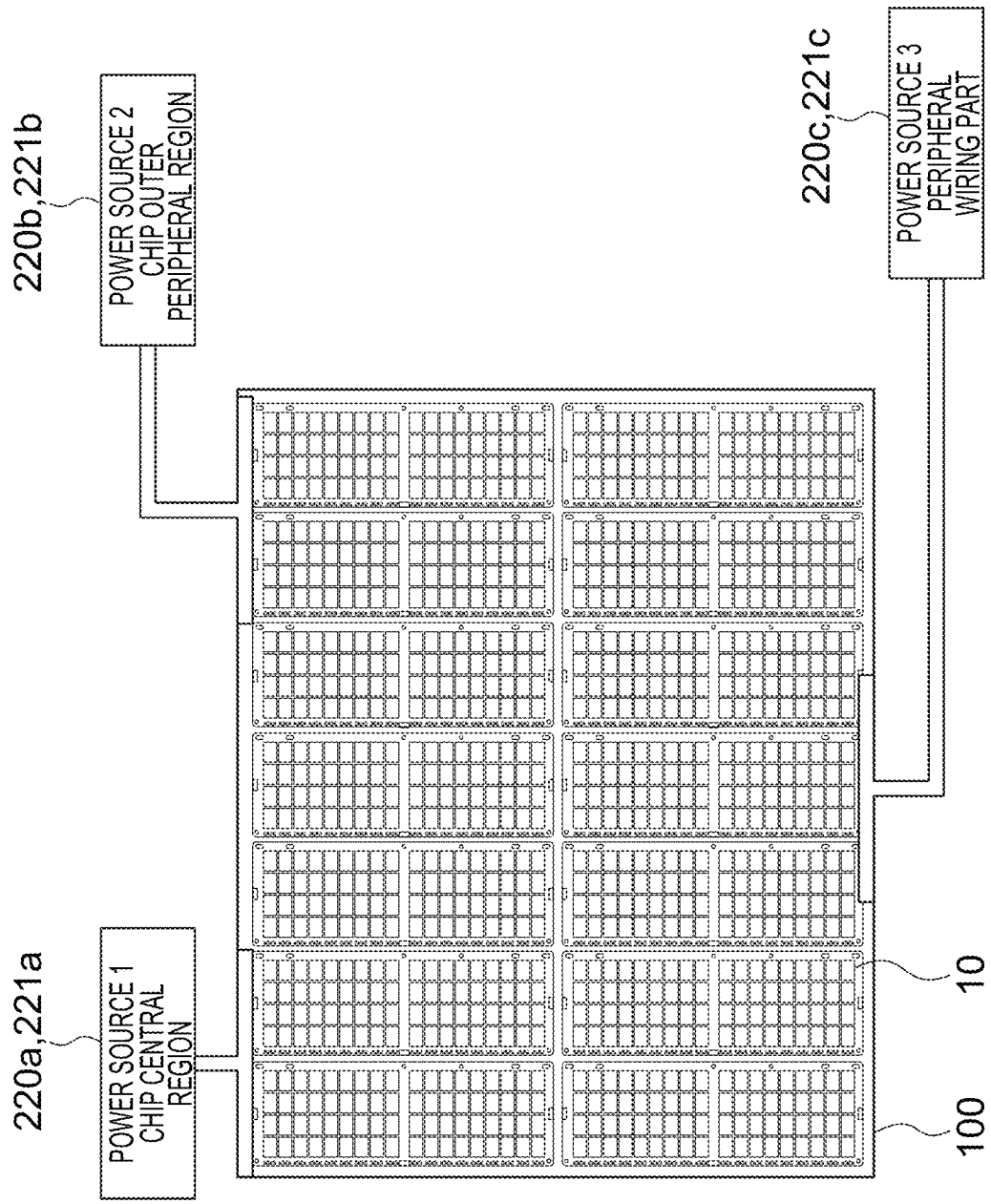
FIG. 19 is a diagram illustrating an exemplary configuration of a multiple substrate according to a modified example of the second embodiment.

FIG. 19 is a diagram illustrating an exemplary configuration of the multiple substrate 100 according to a modified example of the second embodiment. The modified example of the second embodiment is different from the second embodiment in using a plurality of power sources The plating device 200 performs plating in such a way as to supply electric power varying depending on the position on the face F1, thereby forming multiple metal layers M2 (the conductive connection parts 111a and 111b) whose thicknesses are different depending on the position on the face F1, on the face F1.

As illustrated in FIG. 19, the multiple power sources 220 are provided. The power source 220 has a power source 220a, a power source 220b, and a power source 220c. The power sources 220a, 220b, and 220c have power source cathodes 221a, 221b, and 221c, respectively. The power source cathodes 221a, 221b, and 221c are electrically connected to the multiple substrate 100.

The power source 220a is electrically connected to the multiple substrate 100 by wiring (not illustrated) so as to form, for example, the conductive connection parts 111a arranged in the chip central region R11. The power source 220b is electrically connected to the multiple substrate 100 by wiring (not illustrated) so as to form, for example, the conductive connection parts 111b arranged in the chip outer peripheral region R12. The power source 220c is electrically connected to the multiple substrate 100 by wiring (not illustrated) so as to form, for example, the peripheral wiring parts 112. Further, the power sources 220a, 220b, and 220c supply electric power corresponding to thicknesses of the conductive connection parts 111a, the conductive connection parts 111b, and the peripheral wiring parts 112, respectively.

In this manner, changing the power source 220a, 220b, 220c, i.e., the power supply, can adjust the current density depending on the position on the face F1. As a result, the conductive connection parts 111a and 111b and the peripheral wiring parts 112 can be formed so as to have different thicknesses.

Further, in the case of gradually changing the thicknesses of conductive connection parts 111a and 111b in the region from the central part to the outer peripheral end part of the semiconductor chip 20, multiple power sources 220 are used by the number corresponding to the type of thickness.

Further, in the modified example of the second embodiment, for example, an anode 230 having unit electrodes 231 in which the electrode part 231a is arranged on substantially the entire surface of the facing surface may be used.

The semiconductor device 1 according to the modified example of the second embodiment can obtain effects similar to those of the second embodiment. Further, the second embodiment may be combined with the semiconductor device 1 according to the modified example of the second embodiment. The anode 230 used in this case has the unit electrode 231 illustrated in FIG. 18.

Third Embodiment

Figure 20:
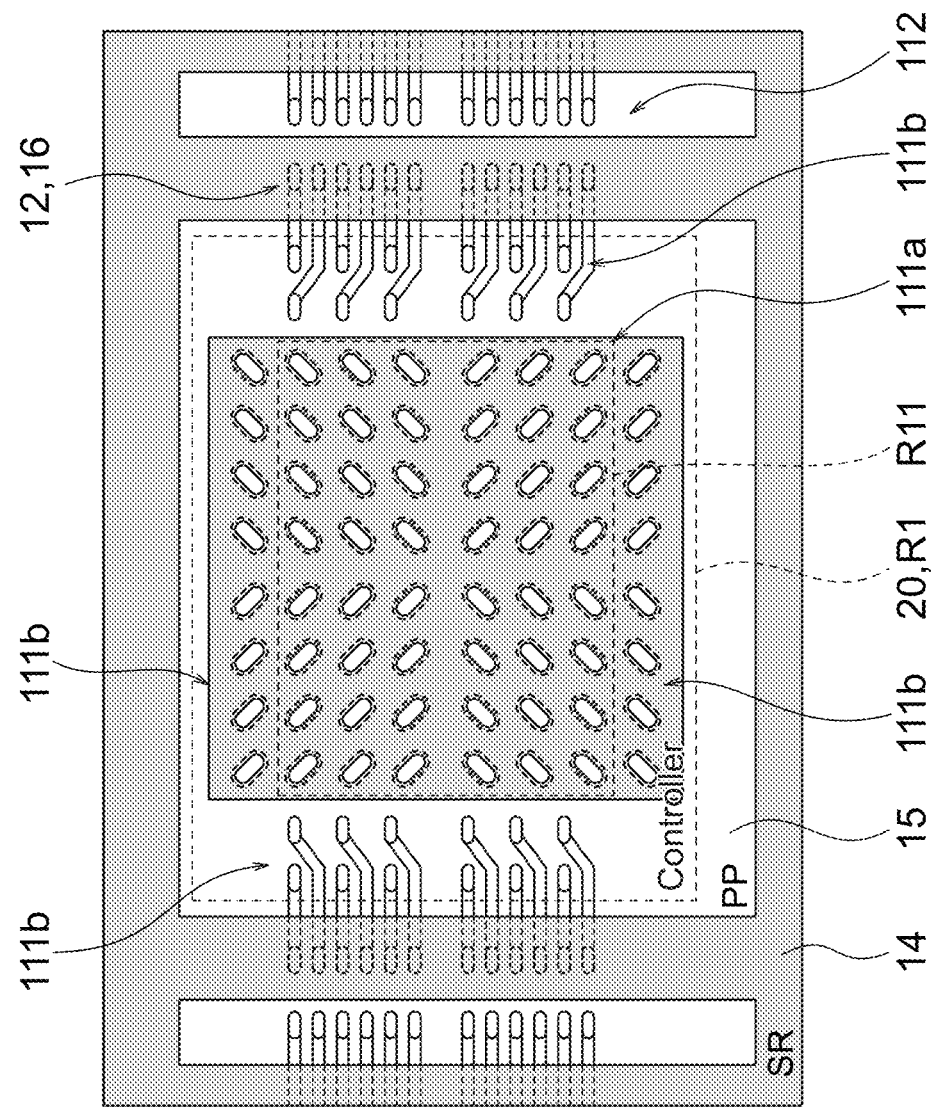
FIG. 20 is a plan view illustrating an exemplary configuration of a semiconductor device according to a third embodiment.

FIG. 20 is a plan view illustrating an exemplary configuration of the semiconductor device 1 according to a third embodiment. In the third embodiment, both the conductive connection part 111b having a pad shape and the conductive connection part 111b having a wiring shape are provided in the chip outer peripheral region R12. That is, the third embodiment is a combination of the first embodiment and the second embodiment.

In the example illustrated in FIG. 20, the solder resist layer 14 is not provided above and below the chip central region R11 in the chip outer peripheral region R12. In the chip outer peripheral region R12, at portions on the right and left sides of the chip central region R11, the solder resist layer 14 is not provided and the insulation layer 15 is exposed.

In the example illustrated in FIG. 20, the conductive connection part 111b having the pad shape is arranged above and below the chip central region R11. The conductive connection part 111b having the wiring shape is arranged on the right and left sides of the chip central region R11.

The conductive connection part 111b having the wiring shape is arranged so as to be separated from the columnar electrode 16 when viewed in the normal direction of the face F1, as illustrated in FIG. 4B. The conductive connection part 111b having the pad shape is arranged so as to overlap with the columnar electrode 16 when viewed in the normal direction of the face F1, as illustrated in FIG. 12B. Accordingly, the conductive connection part 111b is partly arranged so as to overlap with the columnar electrode 16, when viewed in the normal direction of the face F1.

The semiconductor device 1 according to the third embodiment is similar to the semiconductor device 1 according to the first and second embodiments in the rest of the configuration. Therefore, detailed description thereof will not be repeated.

The semiconductor device 1 according to the third embodiment can obtain effects similar to those of the first and second embodiments.

Fourth Embodiment

Figure 21:
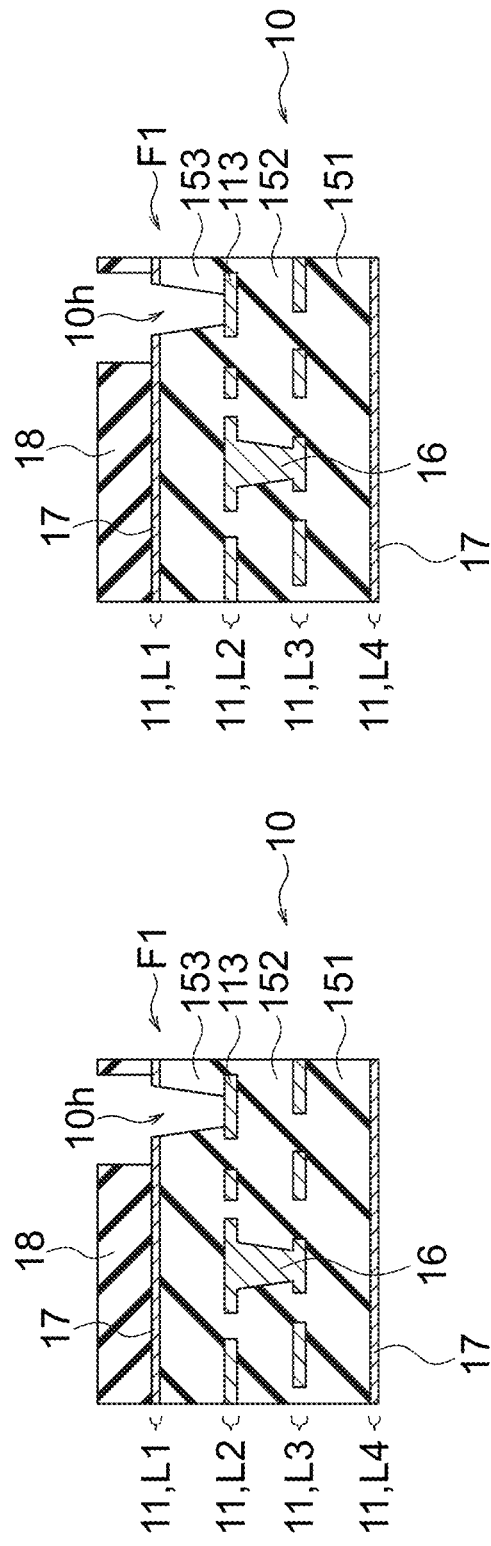
FIG. 21 is a cross-sectional view illustrating an exemplary semiconductor device manufacturing method according to a fourth embodiment.
Figure 22:
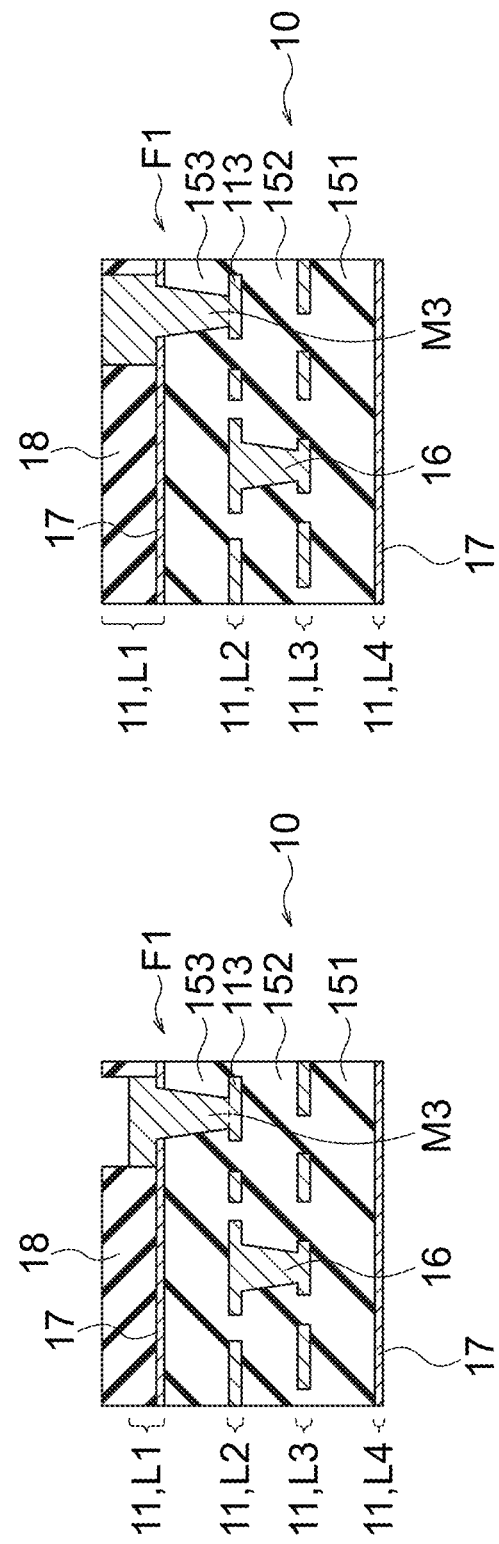
FIG. 22 is a cross-sectional view illustrating an exemplary semiconductor device manufacturing method, which follows the process illustrated in FIG. 21.

FIGS. 21 and 22 are cross-sectional view illustrating an exemplary method for manufacturing the semiconductor device 1 according to a fourth embodiment. The fourth embodiment is different from the second embodiment in that the metal layer is formed in a single process. FIGS. 21 and 22 illustrate cross sections in each of the chip central region R11 and the chip outer peripheral region R12.

Processes illustrated in FIGS. 21 and 22 are performed after processes similar to those of FIGS. 5 and 6.

After the formation of the hole 10h (see FIG. 6), as illustrated in FIG. 21, the plating resist layer 18 that functions as a mask is formed on the copper foil 17 of the wiring layer L1. The plating resist layer 18 is formed to open the region where the conductive connection parts 111a and 111b are formed, for example.

Next, as illustrated in FIG. 22, the metal layer M3 is formed in the hole 10h and on the copper foil 17 (the face F1) of the wiring layer L1. Before forming the metal layer M3, a seed layer may be formed in the hole 10h (for example, on its side wall). The metal layer M3 arranged in the chip outer peripheral region R12 is formed thicker than the metal layer M3 arranged in the chip central region R11, for example, using the method for forming the metal layer M2 described in the second embodiment. The metal layer M3 is, for example, formed by electrolytic plating.

Further, the metal layer M3 is integrally formed. That is, the columnar electrode 16 and the conductive connection part 111a are an integral metal layer M3, and the columnar electrode 16 and the conductive connection part 111b are an integral metal layer M3.

Here, since the electrolytic plating is faster in plating speed than the electroless plating, there is a possibility that the hole 10h is likely to be closed with a cavity formed therein. Therefore, if the electroless plating is unusable for the formation of the metal layer in the hole 10h, the metal layer M3 will be formed, for example, by adjusting the conditions or slowing down the plating formation speed.

After the process illustrated in FIG. 22, processes similar to those of FIGS. 15 and 10 are performed.

The semiconductor device 1 according to the fourth embodiment can obtain effects similar to those of the second embodiment. The fourth embodiment is also applicable to the first embodiment. That is, the conductive connection parts 111a and 111b illustrated in FIGS. 4A and 4B may be formed in a single process. In this case, for example, the metal layer M3 may be formed by electroless plating or may be formed by electrolytic plating.

Fifth Embodiment

The fifth embodiment is different from the first embodiment in that the metal layer M2 is formed by electroless plating. That is, the metal layer M2 illustrated in FIG. 8 is formed by electroless plating.

In the fifth embodiment, both of the metal layer M1 and the metal layer M2 are formed by electroless plating.

The semiconductor device 1 according to the fifth embodiment can obtain effects similar to those of the first embodiment.

Sixth Embodiment

Figure 23:
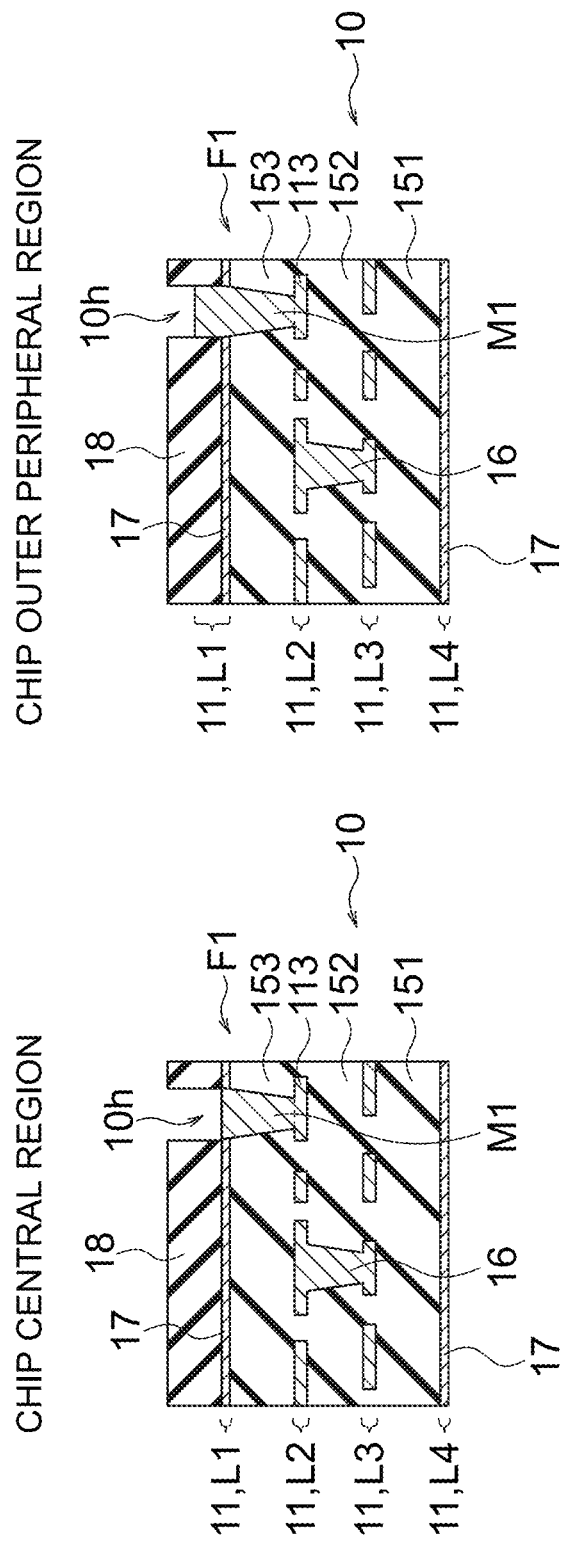
FIG. 23 is a cross-sectional view illustrating an exemplary semiconductor device manufacturing method according to a sixth embodiment.
Figure 24:
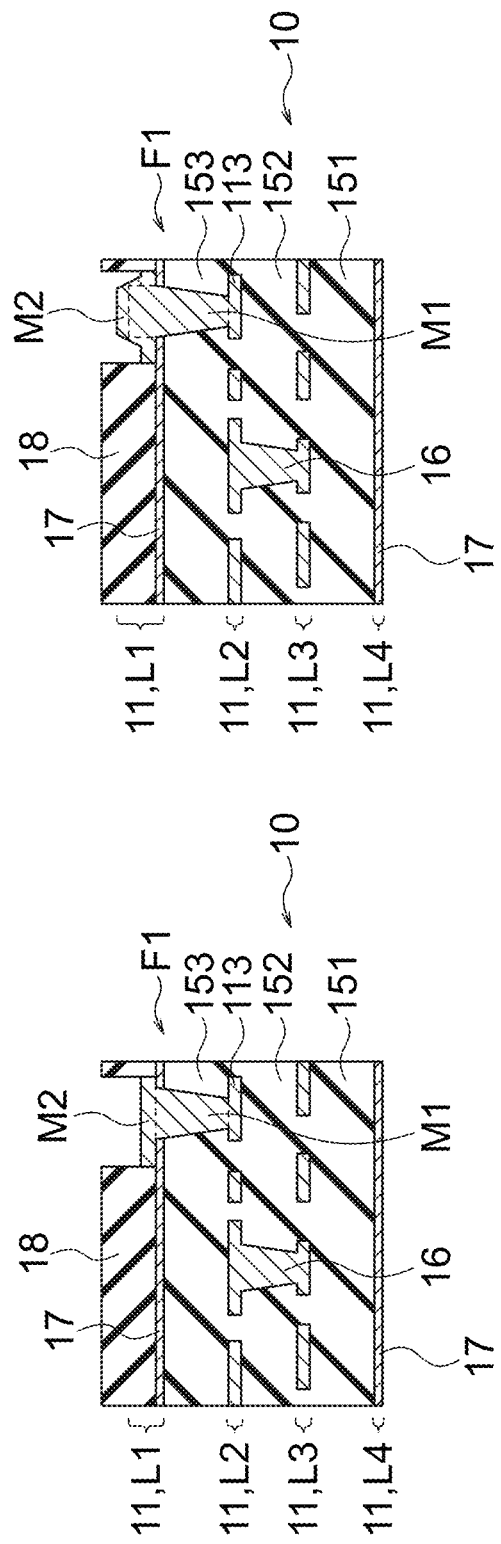
FIG. 24 is a cross-sectional view illustrating an exemplary semiconductor device manufacturing method, which follows the process illustrated in FIG. 23.

FIGS. 23 and 24 are cross-sectional views illustrating an exemplary method for manufacturing the semiconductor device 1 according to the sixth embodiment. The sixth embodiment is different from the second embodiment in that the metal layer M1 is formed by electrolytic plating and the metal layer M2 is formed by electroless plating. FIGS. 23 and 24 illustrate cross sections in each of the chip central region R11 and the chip outer peripheral region R12.

Processes illustrated in FIGS. 23 and 24 are performed after processes similar to those of FIGS. 5 and 6.

After the formation of the hole 10h (see FIG. 6), as illustrated in FIG. 23, the plating resist layer 18 that functions as a mask is formed on the copper foil 17 of the wiring layer L1, and the metal layer M1 is formed in the hole 10h. Before forming the metal layer M1, a seed layer may be formed in the hole 10h (for example, on its side wall). The plating resist layer 18 is formed to open the hole 10h, which is the region where the columnar electrode 16 is formed, for example. The metal layer M1 arranged in the chip outer peripheral region R12 is different in thickness from the metal layer M1 arranged in the chip central region R11. More specifically, the metal layer M1 arranged in the chip outer peripheral region R12 is thicker than the metal layer M1 arranged in the chip central region R11. The metal layer M1 arranged in the chip outer peripheral region R12 is formed thicker than the metal layer M1 arranged in the chip central region R11, for example, using the method for forming the metal layer M2 described in the second embodiment. The metal layer M1 may be formed higher than the face F1 or lower than the face F1. The metal layer M1 is, for example, formed by electrolytic plating.

Next, as illustrated in FIG. 24, the plating resist layer 18 is peeled off, the plating resist layer 18 is formed again on the copper foil 17 of the wiring layer L1, and the metal layer M2 is formed on the copper foil 17 (the face F1) of the wiring layer L1 and the metal layer M1. The plating resist layer 18 is formed to open the region where the conductive connection parts 111a and 111b are formed, for example. As described above, the metal layer M1 arranged in the chip outer peripheral region R12 is thicker than the metal layer M1 arranged in the chip central region R11. Accordingly, even if the metal layer M2 is formed substantially uniformly with respect to the position on the face F1, the metal layers M1 and M2 arranged in the chip outer peripheral region R12 are thicker than the metal layers M1 and M2 arranged in the chip central region R11. The metal layer M2 is, for example, formed by electroless plating.

Further, in the example illustrated in FIG. 24, the upper surface of the metal layer M2 arranged in the chip central region R11 is substantially flat. This is because the upper surface of the metal layer M1 substantially coincides with the face F1. On the other hand, the upper surface of the metal layer M2 arranged in the chip outer peripheral region R12 is not flat. This is because the upper surface of the metal layer M1 does not coincide with the face F1 and protrudes beyond the face F1, for example. As described above, depending on the height of the upper surface of the metal layer M1, the conductive connection part 111a and the conductive connection part 111b may be different in shape of the upper surface.

After the process illustrated in FIG. 24, processes similar to those of FIGS. 15 and 10 are performed.

The semiconductor device 1 according to the sixth embodiment can obtain effects similar to those of the second embodiment. Further, the semiconductor device 1 according to the sixth embodiment may be combined with the modified example of the second embodiment. The sixth embodiment may be applicable to the first embodiment. In this case, the metal layer M1 illustrated in FIG. 7 is formed by electrolytic plating, for example. The metal layer M1 arranged in the chip central region R11 is formed so that the upper surface of the metal layer M1 is lower than the face F1. The metal layer M2 illustrated in FIG. 8 is, for example, formed by electroless plating.

The present invention is not limited to the above-described embodiments. For example, in the first embodiment, both the metal layer M1 and the metal layer M2 may be formed by electrolytic plating. Further, for example, in the second embodiment, both the metal layer M1 and the metal layer M2 may be formed by electrolytic plating. In addition, the conductive connection parts 111a and 111b can be formed in various ways.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate having a first face and a plurality of conductive connection parts provided on the first face; and
a semiconductor chip having a second face that faces the first face and a plurality of connection bumps provided on the second face and electrically connected to the plurality of conductive connection parts,
wherein:
a thickness of a conductive connection part arranged in a chip outer peripheral region of a chip region on the first face where the semiconductor chip is arranged is different from a thickness of a conductive connection part arranged in a chip central region of the chip region,
the substrate further includes a plurality of columnar electrodes provided so as to extend in a normal direction of the first face and electrically connected to the plurality of conductive connection parts, and
the columnar electrodes and the conductive connection parts include:
a first metal layer; and
a second metal layer that is provided above the first metal layer and is different from the first metal layer.

2. The semiconductor device according to claim 1, wherein the conductive connection part arranged in the chip outer peripheral region is thicker than the conductive connection part arranged in the chip central region.

3. The semiconductor device according to claim 1, wherein, a difference between a maximum value and a minimum value from among thicknesses of the plurality of conductive connection parts is in a range of approximately 3 µm to approximately 20 µm.

4. The semiconductor device according to claim 1, wherein:
the conductive connection part arranged in the chip central region is arranged so as to overlap with a corresponding one of the columnar electrodes when viewed in the normal direction, and
the conductive connection part arranged in the chip outer peripheral region is arranged away from a corresponding one of the columnar electrodes when viewed in the normal direction.

5. The semiconductor device according to claim 1, wherein:
the conductive connection part arranged in the chip central region is arranged so as to overlap with a corresponding one of the columnar electrodes when viewed in the normal direction, and
the conductive connection part arranged in the chip outer peripheral region is arranged so as to at least partly overlap with a corresponding one of the columnar electrodes when viewed in the normal direction.

6. The semiconductor device according to claim 1, wherein the first metal layer is provided so as to reach a predetermined height lower than the first face.

7. The semiconductor device according to claim 1, wherein the first metal layers have a substantially same thickness.

8. The semiconductor device according to claim 1, wherein a thickness of the first metal layer arranged in the chip outer peripheral region is different from a thickness of the first metal layer arranged in the chip central region.

9. The semiconductor device according to claim 1, wherein the first metal layer and the second metal layer are different from each other in at least one of a material and a concentration and a type of impurities.

10. The semiconductor device according to claim 1, wherein:
the substrate further includes a first wiring part provided on the first face and arranged in a region different from the chip region, and
a thickness of the first wiring part is between the thickness of the conductive connection part arranged in the chip outer peripheral region and the thickness of the conductive connection part arranged in the chip central region.

11. The semiconductor device according to claim 1, wherein a difference between the thickness of the conductive connection part arranged in the chip outer peripheral region and the thickness of the conductive connection part arranged in the chip central region corresponds to a warpage of the semiconductor chip occurring at a time of being connected to the substrate.

12. The semiconductor device according to claim 1, wherein the thickness of the conductive connection part gradually changes in a region from a central part to an outer peripheral end part of the semiconductor chip.

13. The semiconductor device according to claim 1, wherein the connection bumps have a substantially same thickness or diameter in a region from a central part to an outer peripheral end part of the semiconductor chip.

14. A semiconductor device manufacturing method comprising:
forming, on a first face of a substrate, a plurality of conductive connection parts whose thicknesses are different depending on their position on the first face; and
providing a semiconductor chip having a second face and a plurality of connection bumps provided on the second face on the substrate, so that the connection bumps are electrically connected to the conductive connection parts,
wherein:
a thickness of a conductive connection part arranged in a chip outer peripheral region of a chip region on the first face where the semiconductor chip is arranged is different from a thickness of a conductive connection part arranged in a chip central region of the chip region, and
the semiconductor device manufacturing method further comprises:
forming a plurality of holes on the first face of the substrate;
forming a plurality of columnar electrodes so as to fill the plurality of holes; and
forming a conductive connection part overlapped with a corresponding one of the columnar electrodes, when viewed in a normal direction of the first face, in the chip central region on the first face, and forming a conductive connection part away from a corresponding one of the columnar electrodes, when viewed in the normal direction of the first face, in the chip outer peripheral region on the first face.

15. A semiconductor device comprising:
a substrate having a first face and a plurality of conductive connection parts provided on the first face; and a semiconductor chip having a second face that faces the first face and a plurality of connection bumps provided on the second face and electrically connected to the plurality of conductive connection parts, wherein:

a thickness of a conductive connection part arranged in a chip outer peripheral region of a chip region on the first face where the semiconductor chip is arranged is different from a thickness of a conductive connection part arranged in a chip central region of the chip region, the substrate further includes a plurality of columnar electrodes provided so as to extend in a normal direction of the first face and electrically connected to the plurality of conductive connection parts, the conductive connection part arranged in the chip central region is arranged so as to overlap with a corresponding one of the columnar electrodes when viewed in the normal direction, and the conductive connection part arranged in the chip outer peripheral region is arranged so as to at least partly overlap with a corresponding one of the columnar electrodes when viewed in the normal direction.

16. The semiconductor device according to claim 15, wherein the columnar electrodes and the conductive connection parts comprise an integral third metal layer.

17. The semiconductor device according to claim 15, wherein the columnar electrodes and the conductive connection parts include:

a first metal layer; and a second metal layer that is provided above the first metal layer and different from the first metal layer.

18. The semiconductor device according to claim 17, wherein the first metal layers have a substantially same thickness.

19. The semiconductor device according to claim 17, wherein a thickness of the first metal layer arranged in the chip outer peripheral region is different from a thickness of the first metal layer arranged in the chip central region.

20. The semiconductor device according to claim 17, wherein the first metal layer and the second metal layer are different from each other in at least one of a material and a concentration and a type of impurities.

* * * * *